US011385806B1

(12) United States Patent
Banerjee et al.

(10) Patent No.: US 11,385,806 B1
(45) Date of Patent: Jul. 12, 2022

(54) METHODS AND SYSTEMS FOR EFFICIENT ERASURE-CODED STORAGE SYSTEMS

(71) Applicant: Veritas Technologies LLC, Santa Clara, CA (US)

(72) Inventors: Anindya Banerjee, Maharashtra (IN); Shailesh Marathe, Maharashtra (IN)

(73) Assignee: VERITAS TECHNOLOGIES LLC, Santa Clara, CA (US)

( * ) Notice: Subject to any disclaimer, the term of this patent is extended or adjusted under 35 U.S.C. 154(b) by 0 days.

(21) Appl. No.: 17/140,108

(22) Filed: Jan. 3, 2021

Related U.S. Application Data

(60) Provisional application No. 63/128,158, filed on Dec. 20, 2020.

(51) Int. Cl.
| | |
|---|---|
| *G06F 3/06* | (2006.01) |
| *H03M 13/15* | (2006.01) |
| *G06F 11/10* | (2006.01) |
| *H04L 67/1095* | (2022.01) |

(52) U.S. Cl.
CPC ........ *G06F 3/0619* (2013.01); *G06F 11/1076* (2013.01); *H03M 13/154* (2013.01); *H04L 67/1095* (2013.01)

(58) Field of Classification Search
None
See application file for complete search history.

(56) References Cited

U.S. PATENT DOCUMENTS

| | | | |
|---|---|---|---|
| 8,204,868 B1 | 6/2012 | Wu et al. | |
| 9,021,296 B1* | 4/2015 | Kiselev | G06F 3/0647 |
| | | | 714/6.23 |
| 9,946,486 B1 | 4/2018 | Clifford | |
| 2004/0111557 A1* | 6/2004 | Nakatani | G06F 16/10 |
| | | | 711/113 |
| 2010/0153347 A1* | 6/2010 | Koester | G06F 3/0613 |
| | | | 707/691 |
| 2017/0351743 A1* | 12/2017 | Jayaraman | G06F 16/273 |
| 2019/0073152 A1 | 3/2019 | Nagle et al. | |

(Continued)

OTHER PUBLICATIONS

X. Zhang, D. Feng, Y. Hua and J. Chen, "Optimizing File Systems with a Write-Efficient Journaling Scheme on Non-Volatile Memory," in IEEE Transactions on Computers, vol. 68, No. 3, pp. 402-413, Mar. 1, 2019.*

(Continued)

*Primary Examiner* — Steve N Nguyen

(57) ABSTRACT

Methods and the like according to the disclosure can include determining an information type of digital information, writing the digital information using a first process (in response to a determination that the information type of the digital information is a first information type), and, in response to a determination that the information type of the digital information is a second information type, determining erasure-coded parity information for the digital information and writing the digital information using a second process (where the digital information is to be written to erasure-coded storage). In the former case, the first process that includes writing the digital information to storage. The second process includes writing the digital information and the erasure-coded parity information to erasure-coded storage, without writing the digital information to a log.

20 Claims, 17 Drawing Sheets

(56) References Cited

U.S. PATENT DOCUMENTS

2019/0188098 A1* 6/2019 Gupta .................... G06F 3/067
2019/0354433 A1* 11/2019 Mehra .................. G06F 3/0619
2020/0349110 A1* 11/2020 Shveidel ............... G06F 16/128

OTHER PUBLICATIONS

E. Lee, S. Yoo, J. Jang and H. Bahn, "Shortcut-JFS: A write efficient journaling file system for phase change memory," 2012 IEEE 28th Symposium on Mass Storage Systems and Technologies (MSST), 2012, pp. 1-6.*

Chan, Jeremy C.W., et al.; "Parity Logging with Reserved Space: Towards Efficient Updates and Recovery in Erasure-Coded Clustered Storage,"; The Chinese University of Hong Kong; https://www.usenix.org/conference/fast14/technical-sessions/presentation/chan, 12th USENIX Conference on File and Storage Technologies (FAST '14), Feb. 17-20, 2014, Santa Clara, CA, USA, ISBN 978-1-931971-08-9, pp. 163-176.

Operating Systems [Version 1.01], "Crash Consistency: FSCK and Journaling," www.ostep.org, Chapter 42, 2008-19, pp. 1-21.

Plank, James S., "Erasure Codes For Storage Systems", A Brief Primer, www.usenix.org, Dec. 2013, vol. 38 No 6, pp. 44-51.

Rashmi, K.V., et al.; "A "Hitchhiker's" Guide to Fast and Efficient Data Reconstruction in Erasure-coded Data Center," UC Berkeley, Facebook, SIGCOMM '14, Aug. 17-22, 2014, Chicago, USA. 12 pages.

Subedi, Pradeep, "Exploration of Erasure-Coded Storage Systems for High Performance, Reliability, and Inter-operability", Virginia Commonwealth University, VCU Scholars Compass, Theses and Dissertations, Graduate School, Aug. 2016, 131 pages.

Zhang, Xianbo, et al.; "Method and System For Improved Write Performance In Erasure-Coded Storage Systems," U.S. Appl. No. 16/557,124, filed Aug. 30, 2019; consisting of Specification, Claims and Abstract (60 pages); and Drawings (18 sheets).

* cited by examiner

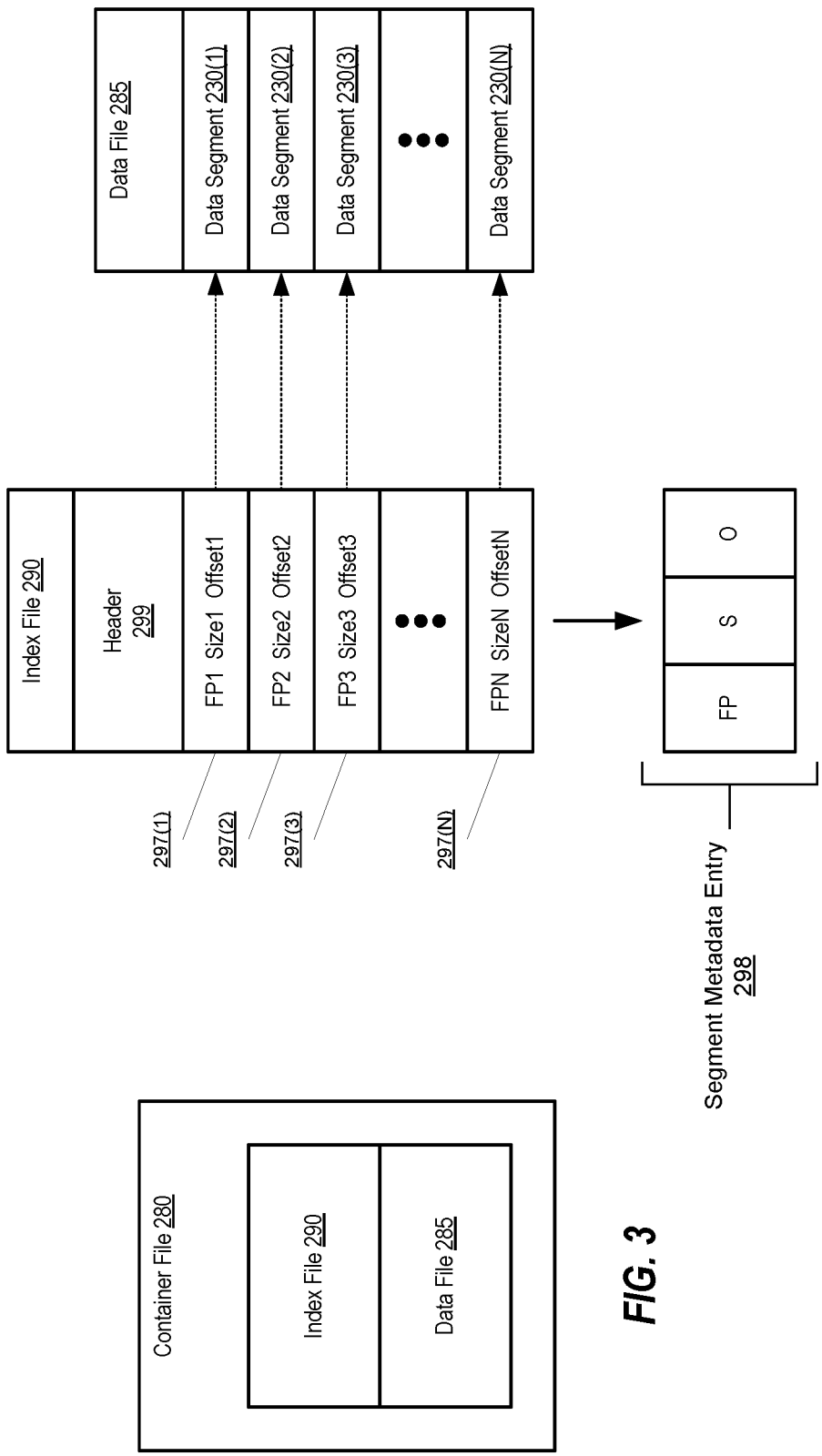

METHODS AND SYSTEMS FOR EFFICIENT ERASURE-CODED STORAGE SYSTEMS

RELATED APPLICATIONS

This application claims benefit under 35 U.S.C § 119(e) of Provisional Patent Application No. 63/128,158, filed on Dec. 20, 2020, entitled "Methods and Systems For Efficient Erasure-Coded Storage Systems," and having Anindya Banerjee and Marathe Shailesh as inventors, which is incorporated by reference herein in its entirety and for all purposes, as if completely and fully set forth herein.

FIELD OF THE INVENTION

The present disclosure relates to the storage of information, and more particularly, to methods and systems for efficient erasure-coded storage systems.

BACKGROUND

An ever-increasing reliance on information and computing systems that produce, process, distribute, and maintain such information in its various forms, continues to put great demands on techniques for providing data storage and access to that data storage. Business organizations can produce and retain large amounts of data. While data growth is not new, the pace of data growth has become more rapid, the location of data more dispersed, and linkages between data sets more complex. Data deduplication offers business organizations an opportunity to dramatically reduce an amount of storage required for data backups and other forms of data storage and to more efficiently communicate backup data to one or more backup storages sites. However, while data deduplication can reduce the amount of information needing to be stored, there remains the need to safely store this (as well as other non-deduplicated) information. One approach is to store multiple copies of such information. Unfortunately, doing so typically leads to significant increases in input/output operations and storage consumption. Such effects can be moderated through the use of erasure coding techniques, but such techniques give rise to their own issues.

SUMMARY

The present disclosure describes methods, computer program products, computer systems, and the like are disclosed that provide for efficient erasure-coded storage systems. Such methods, computer program products, and computer systems can include determining an information type of digital information, writing the digital information using a first process (in response to a determination that the information type of the digital information is a first information type), and, in response to a determination that the information type of the digital information is a second information type, determining erasure-coded parity information for the digital information and writing the digital information using a second process (where the digital information is to be written to erasure-coded storage). In the former case, the first process that includes writing the digital information to storage. The second process includes writing the digital information and the erasure-coded parity information to erasure-coded storage, without writing the digital information to a log.

In one embodiment, the method further includes writing the digital information to a log, and the storage comprises journaled storage, the erasure-coded storage comprises non-journaled erasure-coded storage, the first process writes the digital information to the journaled storage, and the second process writes the digital information to the non-journaled erasure-coded storage. In such embodiments, the journaled storage is a journaled erasure-coded storage volume and the non-journaled erasure-coded storage is a non-journaled erasure-coded storage volume.

In certain embodiments, the information type is one of metadata or data. In such an embodiment, the determining the information type of the digital information can include determining whether the digital information is data or metadata, performing the first process, if the digital information is metadata, and performing the second process, if the digital information is data. In such an embodiment, the storage includes a journaled storage volume, the erasure-coded storage includes a non-journaled erasure-coded storage volume, and the writing the digital information and the erasure-coded parity information to the erasure-coded storage, without writing the digital information to the log, includes writing the data to the non-journaled erasure-coded storage volume of the erasure-coded storage. In such an embodiment, the method can include dividing the data into a plurality of extents, where a size of each extent of the plurality of extents is such that the writing the data to the non-journaled erasure-coded storage volume facilitates the each extent of the plurality of extents being written starting on an EC stripe boundary of the non-journaled erasure-coded storage volume.

In other such embodiments, the storage includes a journaled storage volume, the erasure-coded storage includes a non-journaled erasure-coded storage volume, the first process writes the digital information to the journaled storage, and the second process writes the digital information to the non-journaled erasure-coded storage. In such an embodiment, the method can further include determining other erasure-coded parity information for other digital information and writing the other digital information and the other erasure-coded parity information to the journaled storage. In such embodiments, the journaled storage can be of a storage type, where the storage type is at least one of an EC storage type, a redundant array of independent disks (RAID) storage type, a mirrored (e.g., an n-way mirrored) storage type, or a nested RAID storage type.

In other embodiments, the writing the digital information to the erasure-coded storage comprises the writing the digital information to the log. Further, the method can include embodiments where the storage comprises a journaled storage volume, the erasure-coded storage comprises a non-journaled erasure-coded storage volume, the digital information is a file of a container, and the file is one of a data file or a metadata file. Other embodiments provide for embodiments in which the storage and the erasure-coded storage are spanned by a multi-volume file system, a file system attribute of the journaled storage volume is set to "metadataok", and a file system attribute of the non-journaled erasure-coded storage volume is set to "dataonly".

The foregoing is a summary and thus contains, by necessity, simplifications, generalizations, and omissions of detail; consequently those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE DRAWINGS

Embodiments of methods and systems such as those disclosed herein may be better understood, and its numerous

FIG. 3 is a simplified block diagram illustrating an example of the composition of a container file, according to embodiments of methods and systems such as those disclosed herein.

FIG. 4 is a simplified block diagram illustrating an example of the composition of index file, according to embodiments of methods and systems such as those disclosed herein.

Figure 1:
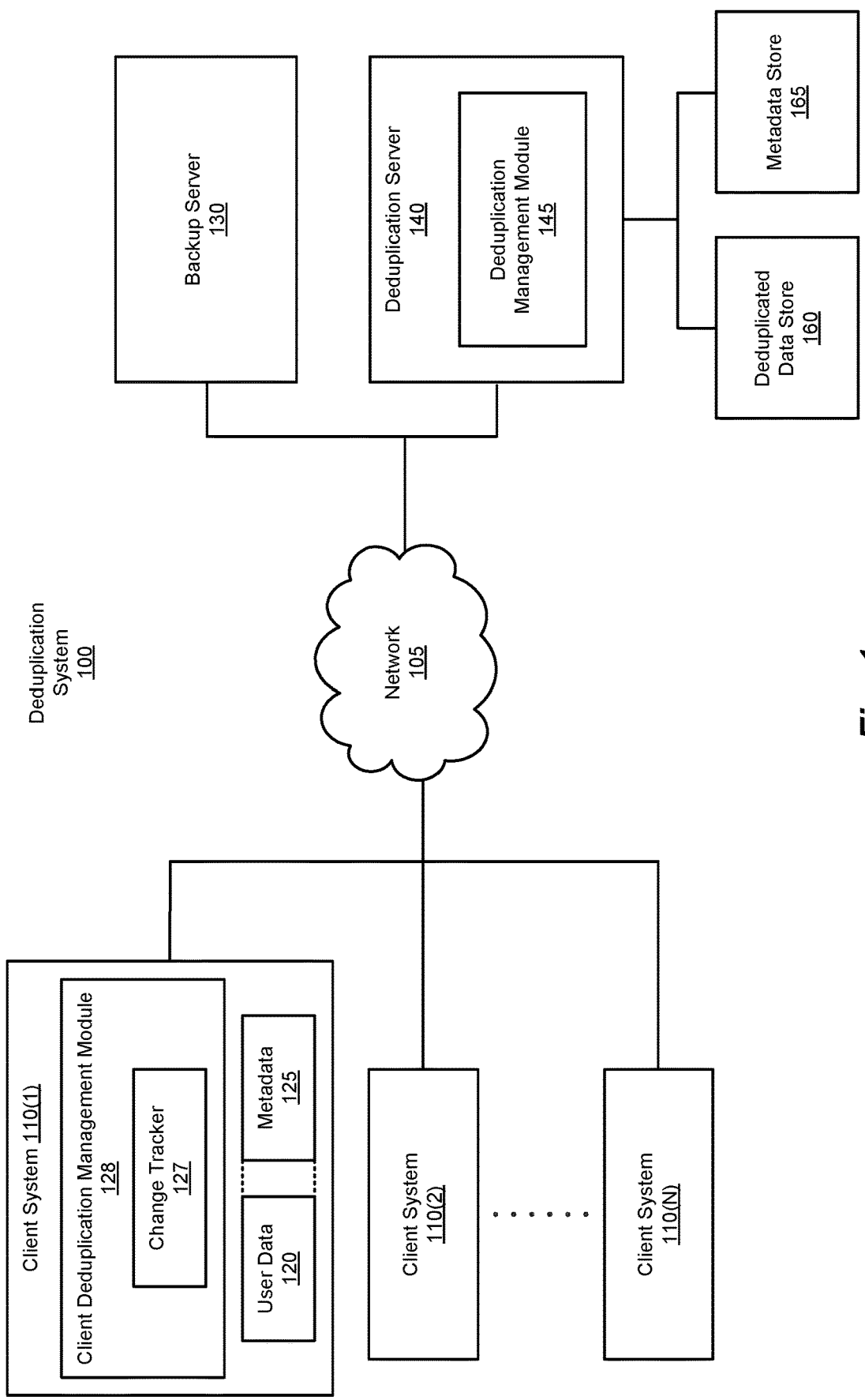
FIG. 1 is a simplified block diagram illustrating components of an example of a deduplication system, according to embodiments of methods and systems such as those disclosed herein.

While embodiments such as those presented in the application are susceptible to various modifications and alternative forms, specific embodiments are provided as examples in the drawings and description of example embodiments. It should be understood that the drawings and description of example embodiments are not intended to limit the embodiments to the particular form disclosed. Instead, the intention is to cover all modifications, equivalents and alternatives falling within the spirit and scope of methods and systems such as those described herein, as defined by the appended claims.

DETAILED DESCRIPTION

Introduction

Broadly, the concepts described herein are applicable to the storage of digital information, and more particularly, to methods and systems for improving efficiency in erasure-coded storage systems. More specifically still, methods and systems such as those described herein provide flexible, efficient, and effective techniques for improved write performance in an erasure-coded storage system by reducing the need for multiple write operations, while maintaining the integrity of the information stored (e.g., in the face of errors and data loss). Methods and systems such as those described herein provide such advantages by performing storage operations that take into account characteristics of the information being stored (e.g., metadata or data) in determining, ultimately, the process by which such information is stored. The processes employed in the storage of various types of information can be implemented, for example, using a number of storage locations that each employ different storage mechanisms. In so doing, methods and systems such as those described herein are able to store such information quickly, efficiently, and reliably.

As will be appreciated, hardware failure is not an entirely uncommon event in today's information processing systems. Also not infrequently, the cause of such hardware failures is related to the storage systems in which such information is maintained. In light of such challenges, data protection has always been, and indeed, continues to be an important consideration in the reliable operation of such information processing systems. Traditionally, for online/operational data, different technologies (e.g., redundant array of independent disks (RAID) storage systems or mirroring/replication storage systems) have been employed to provide fault tolerance. Mirroring provides one or more full redundant copies of the data being protected, with virtually no performance impact, but suffers from a significant increase in storage consumption. Alternatives to mirroring include various levels of RAID storage systems (e.g., RAID4, RAID5, and the like), which provide fault tolerance to a degree that is similar to that provided by mirroring storage systems. While such RAID storage systems are able to provide fault tolerance with less storage than that needed by a storage system employing mirroring, RAID storage systems are limited with respect to the level of fault tolerance such technologies can provide (essentially being limited to a 2x level of fault tolerance). Thus, as such systems increase in scale, the ability to withstand more than two storage subsystem failures becomes an increasingly pressing issue.

To address such limitations, erasure coding can be employed to both provide a desired level of fault tolerance, and to do so with less storage than might otherwise be required. Erasure coding is a forward error correction technique for data protection that adds redundant coding information to the original data and then encodes their combination such that the original data is recoverable, even if a portion of the encoded data is unavailable (e.g., due to a failure of some sort). Erasure coding transforms the original data of k data chunks into a larger amount of data (the encoded data) with in symbols such that the original message can be recovered from a subset of the m encoded data chunks.

For example, k chunks of original data is erasure coded into k+m chunks of encoded data. In general, when erasure coding is employed, the addition of in redundant data chunks provides fault tolerance of up to m lost data chunks (i.e., the original data ($D_1 \ldots D_k$) is recoverable, so long as no more than any of m data chunks of the encoded data chunks have faulted). Such a system is referred as a (k, m) erasure-coded system. Erasure codes are compared, primarily, based on two properties.

1. Whether the code is systematic or non-systematic. A systematic code keeps the original data in clear form, while a non-systematic code encodes the original data.
2. Whether the code is MDS (Maximum Distance Separable) or non-MDS. If m redundant data chunks are used for erasure coding and the original data is recoverable even with the loss of any m coded data chunks, it is MDS. Otherwise, the erasure code is non-MDS. Thus, this aspect of erasure coding essentially hinges on the erasure code's level of efficiency with respect to storage requirements of the code. In this regard, storage efficiency comes at the cost of performance, and so is a trade-off between MDS and non-MDS erasure codes.

Examples of some erasure codes used in storage systems include:
Reed-Solomon (RS) codes, which are systematic and MDS.
Local Reconstruction codes with RS, which are systematic and non-MDS, and tend to perform better than pure RS codes, as less computation needed for encoding/decoding.
Tornado Codes, which are systematic and non-MDS, and provide high-performance, but are not as storage-efficient.

To illustrate the operation of erasure codes, a simple example is as follows. Let x be a first data chunk and y be a second data chunk, which are to be encoded and stored. In this example, the following equations are used to perform the encoding:

$$p_1 = x + y$$

$$p_2 = x + 2y$$

The following data chunks are thus stored: x, y, $p_1$, and $p_2$. These data chunks are each stored on a corresponding, independent storage system (e.g., a storage node such as a solid state device, a hard disk drive, a network-attached storage device, or other such independent storage system). While the foregoing equations are greatly simplified for purposes of this example, it will be appreciated that, the availability of any two of the four independent storage systems would allow for the recovery of the two original data chunks.

In light of the foregoing, it will be apparent that the level of redundancy needed to provide a desired level of fault tolerance can be determined using a metric referred to as reception efficiency. Reception efficiency can be calculated as:

$$RE = ((k+m)/k)$$

Thus, given any k data chunks to encode, a set of M linear equations for computing additional code symbols can be constructed, resulting in m additional data chunks. Assuming, as is the case, that the linear equations are chosen such that any M taken together are linearly independent, if any N of these symbols are lost, M equations in m variables will still be available, and so produce a unique solution. As a result, the original data (k) can be recovered. It will therefor be appreciated that the number of data chunks that can be lost can be selected in this manner, and so the amount of storage required support a given level of fault tolerance. Moreover, the failure domain addressed by such methods can be node-based, based on storage unit failures (e.g., disk-based), or based on some other point of failure.

Further, such an approach uses significantly less storage than other techniques, for that level of fault tolerance. For example, a (5, 3) erasure encoded storage system can withstand up to three faults and still provide for the recovery of the original data. Such a storage system would consume, using 1 TB independent storage systems as an example, 8 TB of storage. By market contrast, a mirrored storage system providing the same level of fault tolerance would employ 4 copies of the original data, and so consume 20 TB of storage. The advantage of erasure coding in such comparisons increases exponentially with further increases in the level of fault tolerance. This aspect makes ECS attractive for long-term data retention, such as in data backup applications, where a comparatively large amount of storage space might otherwise be required.

Despite their desirable characteristics, EC storage systems are not without their weaknesses. For example, a stripe write operation that fails (either because of a partial overwrite of existing data or partially-written new data) can result in the corruption of otherwise-correct data already stored in the given stripe and/or erroneous parity information for the stripe. Thus, the writing of information should be performed in a manner that avoids partial writes of new information and partial overwriting of existing information, in order to prevent data loss/corruption in the event of failures during ECS stripe write operations. Moreover, comparatively high ingestion rates are typically desirable because, while more space efficient that other approaches, the amount of data being processed remains substantial.

To address such issues, information to be written to an EC storage unit (e.g., a file created in EC storage) can be journaled (e.g., written to a log file), and then applied to the unit of storage (e.g., the file in EC storage). Thus, information written to EC storage in this manner is first journaled, and then written to EC storage. Once the ECS system indicates that the information in question has been successfully written, the copy of the information stored in the log can be removed. In this way, writes to the log can complete, with the assurance that the information in question will ultimately being safely, successfully written to EC storage. However, such assurance comes at a price—such journaling results in the same information being written twice: once into the journaling log, and again, to the EC storage unit. Such "double writes" increase write overhead, and so, significantly reduce the overall system throughput.

To address such further complications, methods and systems such as those described herein separate information to be stored into multiple categories (information types), based on one or more characteristics of various portions thereof, and employ various storage processes and/or mechanisms to reliably, efficiently write certain (or all) of those portions to EC storage. For example, such embodiments can store information effectively and efficiently by distinguishing between information that should be journaled (e.g., as a result of its characteristics, whether stored in EC or other another type of storage), and that which can be stored in EC storage without being journaled (e.g., as a result of that information's characteristics, and through the use of processes in the manner of those described herein).

One situation in which information can be separated in this manner is where the information to be stored includes metadata (which, in certain embodiments, is stored in journaled storage) and data (which, in certain embodiments, is stored in storage that is not journaled (non-journaled storage)). In certain applications, data does not change frequently (e.g., backup applications), and so is essentially written only once. The relatively static nature of such data permits the use of non-journaled EC storage, if certain constraints can be tolerated, in order to ensure data integrity. Such constraints are particularly tolerable when compared to the "double write" penalty journaling would incur. By contrast, metadata is likely to change often (at least during backup operations), and is, typically, significantly smaller than its data. This makes storage of such metadata in journaled storage more appropriate, and the overhead resulting from the "double write" penalty incurred by journaling, tolerable.

An example of an environment in which data and metadata having such characteristics might exist, and so give rise to the need for the storage of both types of information, is that of a deduplicated backup system. In a deduplicated backup system, data is divided into pieces (e.g., referred to herein as "data segments") and only unique ones of those pieces stored. In order to keep track of information regarding such data segments, metadata is maintained. Such metadata can include information such as, for example, a segment fingerprint for the corresponding data segment, the data segment's size, and location information for the data segment, as well as other information (e.g., checksum information, compression information, encryption algorithm information, and so on). Data segments and their corresponding metadata are, in one embodiment, each grouped with similar information into data containers (e.g., in one or more data files and one or more corresponding metadata files). Such data containers may be based on the source of the backup data in question, thereby providing better locality.

In a situation in which such data and its associated metadata are to be maintained in a storage system, the data in question (e.g., data segments stored in a container's one or more data files) is not journaled when being written (to EC storage), but its associated metadata (e.g., metadata stored in the container's one or more metadata files) is written to a journal and then stored in the storage system (whether that portion employs EC, RAID, or another storage paradigm) in a transactional fashion (and so, in a manner in which the operation can succeed or fail as a single operation, without untoward effects on other such transactions (whether occurring before or after)). In one embodiment, each such container is composed of a container metadata file that includes each segment's metadata information (e.g., identified with a readily cognizable extension (e.g., ".map")), and a container data file that includes the backed-up data segments (e.g., identified with another readily cognizable extension (e.g., ".bin")).

Techniques such as those described herein are particularly advantageous where, as is often the case, the amount of storage space consumed by metadata is significantly smaller than that needed for data associated therewith, as is described in greater detail subsequently. Thus, the amount of information needing to be written (or, potentially, written, read, and written again), is significantly reduced. For example, such techniques can be employed to good effect in data storage systems employing deduplication (e.g., deduplicated data backup systems), which store data backups in containers. Such containers can include container files separated as to data (e.g., files containing data segments) and metadata (e.g., files containing information about the data segments), which is described in greater detail subsequently. That said, it will be appreciated that, in light of present disclosure, techniques such as those described herein are advantageous in any situation in which certain portions of the information to be stored are, in relative terms, small, while other portions thereof are, also in relative terms, large.

Thus, to improve performance in such situations, a distinction can be made based on whether a container data file or a container metadata file is being stored. In making such a distinction, the added overhead involved in journaling the (comparatively large amounts of) data can be avoided. By contrast, the storage of container metadata files (which, in fact, may include update operations and append operations) can be performed with journaling. Given the relatively small amount of information involved, such journaling carries with it a relatively small amount of overhead. Embodiments such as those described herein thus provide a balance between ensuring that information is stored in a reliable fashion and performing such storage in an efficient manner. Such embodiments achieve this balance by distinguishing between information to be stored in journaled storage (e.g., information that is subject to comparatively frequent modification, but is comparatively small in size, such as the metadata described herein) and information that can be stored in non-journaled storage (e.g., information that is subject to comparatively infrequent modification, but is comparatively large in size, such as the data described herein).

In so doing, and using techniques described subsequently, efficient storage of backup information (e.g., that includes metadata and data) can be performed, while ensuring the data integrity of both the backup and any previous backups in the event of failures (e.g., node or storage unit failures). Moreover, given that metadata is, typically, substantially smaller than the data it describes (given that such description is only with regard to the characteristics of the data described thereby), such an approach is particularly useful in significantly reducing the amount of information needing to be subjected to the aforementioned "double writes" of data by taking steps to allow such data to be stored in non-journaled EC storage. In this regard, methods and systems such as those described herein provide certain functionalities and mechanisms to maintain the data integrity of data stored in non-journaled EC storage. That said, it will be appreciated that, while metadata (and other information) is discussed at various points herein as being stored in journaled EC storage, the type of storage (storage type) of the storage unit underlying the journal log in question can be of any appropriate storage type, so long as the storage of the information subject to journaling can be assured of being stored in a sufficiently reliable fashion, once such storage has been confirmed.

As noted, embodiments such as those described herein store digital information, at least in part, by distinguishing between various portions of that information (units of digital information) based on those portions' characteristics, in order to identify each such portion's information type, and employing different storage processes and mechanisms for each such information type. In the context of deduplicated data backup, this translates to distinguishing between data and metadata, and storing such data and metadata (e.g., data files, in which data is stored, and metadata files, in which metadata is stored) in respective storage units (e.g., storage volumes). For example, in a given file system according to embodiments such as those disclosed herein, such a file system can be implemented using object storage. Such objects, being "write once read many" (WORM) storage volumes, can be stored in a volume without logging, so long as certain constraints are observed. Alternatively, metadata (such as for maintaining mapping of object name to actual file) can be stored in the volume with logging. Such aspects are described in greater detail subsequently.

One way to provide such respective storage units (whether both are EC storage, or a combination of EC and non-EC storage is employed) is to employ a file system that facilitates storing data and metadata in different types of storage units (that is, storage units of differing storage unit types, or more simply, storage types, as noted). For purposes of this disclosure, a storage unit can be one or more physical storage devices (all or a portion thereof) and/or one or more logical storage devices (and again, all or a portion thereof), though for the present discussion, it is noted that certain implementations can employ multiple storage units such as volumes, each of which is either non-journaled EC storage or journaled storage (of any acceptable storage type). A file system that spans multiple ones of such volumes can be referred to as a multi-volume file system (MVFS). In an MVFS, a single file system can be created that spans over multiple volumes, with each volume having its own properties (e.g., with and without journaling, EC and non-EC storage, and so on, in any appropriate combination). Using an administrative interface, an administrator or other user can configured where various types of information are stored. Thus, by allowing the file system to reside on different classes of devices by spanning multiple block spaces of different types, data and metadata can be stored on EC volumes appropriate to their information type, for example. Such an MVFS can be used to store such data and metadata by marking the storage volumes of the MVFS as either "dataonly" (data can be stored without journaling on such a volume, as long as the appropriate process is followed to ensure data integrity, but only data) or "metadataok" (indicating that metadata, as well as other digital information (including data), can be stored on this volume, as journaling is enabled for the volume). Such marking can be accomplished, for example, by setting a file system attribute of the MVFS. In certain embodiments, such file system attribute(s) can be set to ensure that new allocations in the volume(s) without logging are performed in a stripe-aligned manner, and in integer multiples of stripe length.

Such methods and systems can, for example, create a volume set having one or more volumes that provide journaling, and one or more volumes without journaling. In one implementation, a multi-volume file system (MVFS) hosts such a volume set's file system metadata, in addition to the backup system's container metadata, on one or more journaled volumes (i.e., with one or more journals employed). Once such metadata is written to the appropriate log (also referred to herein as being "journaled"), the metadata stored in the log can be flushed to storage, and, once successfully flushed from the log, cleared from the log (e.g., deleted or the storage space in the log otherwise reclaimed).

With regard to the data to be stored, such data is written directly to EC storage (without the intermediate step of being written to a log), thereby avoiding the need to write such information twice (once to a log, and then again, to EC storage). To store the data safely, the data can be written in such a way that issues with respect to data correctness are avoided, despite being written to a volume that does not provide journaling. In certain embodiments, storage policies are configured to maintain such data in volumes that do not provide journaling, at least until such time as those volumes become full.

To this end, it is to be appreciated that many applications have data that is written only once, but is then available to be read as many times as needed (e.g., data containers in backup storage data pools, cloud-based object storage, and the like). Such storage is referred to as "write once, read many" (WORM), and is made available for such read operations only if the data is successfully written. Such constructs can be used to avoid the overwriting of data, as is desirable in methods and systems such as those described herein, by simply writing new (and existing) information to a new WORM storage object and disposing of the previously-written WORM storage object. Thus, a WORM storage object can be used to avoid the unwanted overwriting of data, with the reading of such WORM data permitted only upon the successful writing thereof. Further in this regard, constraints can be put in place to prevent more than one process (thread or the like) from writing to a given EC stripe at any one time (e.g., as writing on EC stripe boundaries in whole EC stripes facilitates). In so doing, the corruption of already-stored data can be avoided, while also avoiding the need to journal the data being written.

In view of the foregoing, methods and systems such as those described herein create an MVFS spanning multiple volumes. One (or more) of these volumes is journaled (e.g., indicated by its being marked with a file system attribute of "metadataok"), while one (or more) of the remaining volumes is (are) configured without journaling (e.g., indicated by its being marked with a file system attribute of "dataonly"). Allocation policies are then configured (e.g., through a file system administration interface). In such a system, this can be accomplished by setting one or more file system attributes, such that data is stored in one or more non-journaled volumes, while metadata is stored in one or more journaled volumes. For example, such a file system attribute might be set to one of "dataonly" or "metadataok" for each volume spanned by the given MVFS. In that case, container data files would be stored in non-journaled volumes (as a result of such non-journaled volumes being marked with a file system attribute of "dataonly," and thus being write-once information and, subject to constraints such as those described herein, WORM data written such that data integrity is maintained, while other files (including container metadata files) would only be stored in journaled volumes (as a result of such non-journaled volumes being marked with file system attribute of "metadataok"). In so doing, embodiments such as those described herein are able to safely store data in one or more "dataonly" volumes of EC storage without journaling that data, while also safely storing other information (metadata and/or other information) in one or more "metadataok" volumes (whether EC, RAID, n-way mirrored, or other sufficiently reliable storage). That said, if the one or more "dataonly" volumes become full, data (e.g., container data files) can then be stored in one of the "metadataok" volumes (though with the attendant "double write" penalty). Given the fact that such overflow would be infrequent (and addressable through the allocation of more non-journaled storage space), the occurrence of such overflow can be avoided and/or maintained at a tolerable level.

With regard to the storage of data in non-journaled EC storage volumes, certain steps can be taken to ensure the integrity of data thus stored in EC storage, as noted. For example, a storage policy can be configured for such non-journaled volumes, to store data (e.g., data extents or the like) in a manner that aligns such data on EC stripe boundaries. Further, such a storage policy is preferably configured such that the length of data extents are an integer multiple of the EC stripe length. Thus, when performing write operations on data, the data written is divided into whole and/or partial EC stripe lengths when written to storage. In one embodiment, the resulting partial stripe (if any) is written first, followed by the writing of one or more full stripes' worth of metadata/other information (again, if any). As will be appreciated, this may result in the last data written filling only a partial EC stripe.

For example, consider a volume with a 4:2 erasure-coding layout. Such a volume will be distributed across 6 storage devices (e.g., 6 disks, nodes, or other such storage subsystems, whether virtual or physical), each of which is referred to as a column. The total volume space is divided into lots of equal-sized stripes, with each stripe being distributed across the 6 columns. The length of a chunk from a column contributing to a stripe is referred to as stripe unit, for example 64 KB. In the present example, the length of the stripe is referred to as stripe length (64 KB*4=256 KB), where two of the stripe units are used for parity for that stripe.

Such a stripe can be written to without having corruption, by adhering to the following rules:
1) Data is not read unless that data is successfully written. If a write operation fails, the write operation is discarded.
2) Data is not overwritten. Otherwise, we can have a successful write operation, and the data in question can be read. However, data corruption can occur due to a failure during a second write operation.
3) Parallel write operations are not performed on the same EC stripe (i.e., two or more write operations are not performed on the same stripe at the same time (e.g., do not overlap—one write operation should successfully complete before another is begun)).

Rules 1 and 2 can be satisfied through the use of WORM techniques. Examples of such data constructs are object data structures, data container files in backup storage systems, and the like, as noted. In order to achieve objective 3, a data storage parameter (e.g., to set the manner in which data extents are handled) can be used for a file's allocation, such that a file's extent allocation is aligned to an EC stripe boundary (ECSB), and causing the allocation in a chunk to be performed in a manner that the allocation is a multiple of the stripe length in size. This ensures two files are not written in a single stripe. While such an allocation can result in some level of internal fragmentation (loss of space), such inefficiency is typically at an acceptably-small level for generally large files.

Storage policy can be set so that files such as data backup container files (e.g., as determined based on the file extension) are stored in one or more volume(s) without journaling. For data object storage, objects (e.g., regular files in the file system) are stored in such a volume. On the other hand, file system metadata (i.e., metadata regarding various file system structures and information) is stored in a volume with journaling (again, whether the underlying storage type is EC storage, RAID storage, n-way mirrored storage, or other such sufficiently reliable storage). Such a storage policy also ensures that if the volumes without journaling become full, then that information can be stored in a volume with journaling (from a correctness perspective, doing so in such instances does not affect the risk of errors, although performance can degrade to a certain extent, given that such storage will result in the additional write operations that result from the journaling performed). Conversely, the storage policy employed can prevent metadata files (and other information intended for storage in a journaled volume) being stored in a non-journaled volume. As a result, during creation of the file system, a journaled volume will typically be allocated at a size that is actually slightly larger than required, to account for the need to store such file system metadata. During file system growth, care is taken to ensure that volumes are grown in a proportionate manner for this reason.

Thus, methods and systems such as those described herein provide the advantages of EC storage for the majority of the information stored, while addressing the need for sufficiently reliable, efficient storage processes for the information being stored. By providing the ability to differentiate information based on that information's characteristics, and employ storage processes and mechanisms appropriate to each such information type, such methods and systems are able to store such information in a manner appropriate to that information. For example, as between data and its associated metadata, such methods and systems are able to store such data and metadata on respective storage units (e.g., volumes), and in so doing, avoid the need to "double write" the data in question, in order to maintain data integrity. Further, file system "out-of-storage-space"-type errors can be avoided in cases in which the file system's data storage units do not have sufficient space remaining to store data, by allowing such data to be written to metadata storage units. And as noted, such techniques avoid the read-modify-write overhead that can be associated with journaled storage when writing data to EC storage, while allowing metadata to be written to storage with sufficient reliability (whether that storage is EC storage, RAID storage, n-way mirrored storage, or another storage type of sufficient reliability). In addition to the aforementioned advantages, architectures according to embodiments such as those described herein provide a number of other benefits, as will be appreciated from the following description.

Example Deduplication Architecture

FIG. 1 is a simplified block diagram illustrating components of an example of a deduplication system (depicted, for example, as a deduplication system 100), in which embodiments such as those disclosed can be implemented. Deduplication system 100 includes a network 105 that communicatively couples one or more client systems 110(1)-(N), a backup server 130, and deduplication server 140 (includes a deduplication management module 145). Each component is discussed in further detail below.

One or more client systems 110(1)-(N), also referred to herein as client devices 110 and/or client systems 110, can be implemented using, for example, a desktop computer, a laptop computer, a workstation, a server, or the like. An example of such computing devices is described subsequently. One or more client systems 110(1)-(N) can be configured to communicate with backup server 130 and deduplication server 140 via network 105. An example of network 105, which can be used by client systems 110 to access backup server 130 and deduplication server 140, is a local area network (LAN) utilizing Ethernet, IEEE 802.11x, or some other communications protocol. While FIG. 1 illustrates client system 110(1) including user data 120 and metadata 125 (and such being associated with one another, by dotted lines), each client system can store different user data 120 and metadata 125 in storage local to the client system.

Also shown as being implemented in client system 110(1) is a change tracker (illustrated in FIG. 1 as a change tracker 127). Change tracker 127 can be implemented, for example, as part of a client deduplication management module (illustrated in FIG. 1 as a client deduplication management module 128). Moreover, change tracker 127 can be implemented, for example, as a change block tracker, detecting data (e.g., data blocks) written by, for example, an application executed by client system 110(1). Such a change block tracker can track units of storage (e.g., disk sectors, data blocks, or the like) that have been changed, for example, by the aforementioned application. Such a list of changed units of storage is referred to herein as a data object change tracking list, or more specifically, a file change tracking list (and more generically as a change tracking stream). Once identified, such changed units of storage can be transferred from the computing system in question to a backup server (e.g., backup server 130) or a deduplication server (e.g., such as deduplication server 140), for example. In certain embodiments, such changed units of storage can be sent to a proxy server, for further conveyance to the proper destination, then or at a later time. As will be appreciated in light of the present disclosure, such an implementation is presented merely as an example, and such change tracking can be performed by any computing device shown in FIG. 1 (e.g., by deduplication server 140) and/or another computing device not shown in FIG. 1.

User data 120 can include various data that is generated and/or consumed by a user of client system 110(1). User data 120 can include executable files, such as those used to implement applications and operating systems, as well as files that are used or generated by such executable files. User data 120 can include files generated by user applications (e.g., word processing programs, email programs, graphics programs, a database application, or the like) executing on client system 110(1). Some of the user data 120 may also be transferred to backup server 130 and/or deduplication server 140 via a network 105 to be included in deduplicated data store 160, and the associated metadata (e.g., metadata 125). Each of client systems 110 can send different user data and metadata to backup server 130 and/or deduplication server 140.

Metadata 125 can include data about the user data 120. Metadata 125 can be generated by client system 110(1), such as during a backup process. Whenever a user (e.g., an application or human user) requests that client system 110 add all or part of user data 120 to the deduplicated data store 160 (e.g., as part of a regularly scheduled full or partial backup of the client system), client system 110(1) can read user data 120 and metadata 125 (or generate metadata 125 about user data 120), such as one or more identifiers (also referred to herein as signatures), that can identify different portions of user data 120. Client system 110 can provide metadata 125 as a list (e.g., a list of signatures) to deduplication server 140. Metadata 125 can be used by deduplication server 140 to determine whether a portion of user data 120 is not already stored in deduplicated data store 160 (and so should be added to the deduplicated data store 160, as further discussed below).

As noted, backup server 130 is also coupled to network 105. Backup server 130 can include one or more physical servers configured to perform a variety of tasks related to management and implementation of backup services for deduplication system 100, such as performing a full or partial backup of a client system. In deduplication system 100, backup server 130 is further configured to communicate with deduplication server 140 for purposes of storing backups of data from client systems 110(1)-(N) in resources controlled by deduplication server 140. Such communication can be via network 105 or via a direct link between the backup server 130 and deduplication server 140. Information that can be provided by backup server 130 to deduplication server 140 can include a unique identification associated with each data stream provided by one of client systems 110(1)-(N) to the deduplication server 140. The backup server 130 can also provide sequence number identification for to identify sequential data transmitted in each uniquely identified data stream. Deduplication server 140 (and more particularly, deduplication management module 145) can then use such information to associate received data streams from client systems 110(1)-(N) in accord with embodiments of the present invention, as further discussed subsequently.

Backup services can be implemented in deduplication system 100 as a client-server application (not shown), with a server component (e.g., residing in backup server 130) and a client component (e.g., residing on client systems 110) of the client-server application. A server component can be configured to communicate with a client component during a backup process. Certain functions of the backup services can be performed by the client and server components, where the functions may be divided between the two components, or may be performed completely by one component or the other, depending on the implementation of the backup application. For example, backup server 130 can be configured to perform tasks that include communicating with client systems 110 to initiate backup tasks on the clients, maintaining databases related to files and other information backed up from file systems associated with the clients, and managing or tracking resources storing backups of client systems 110.

Deduplication server 140 is also coupled to network 105 and performs a variety of tasks related to management and implementation of deduplication services for the system illustrated in FIG. 1. Deduplication server 140 can include one or more physical servers configured to perform a variety of tasks related to deduplication services, which can be managed by deduplication management module 145. For example, deduplication server 140 can provide deduplication services for eliminating duplicated data content in a backup context. Deduplication services help reduce an amount of storage needed to store backups of enterprise data (e.g., user data 120) by providing a mechanism for storing a piece of information only one time. Such storage can be managed by deduplication management module 145. Thus, in a backup context, if a piece of information is stored in multiple locations within an enterprise (e.g., on multiple client systems 110), that piece of information will only be stored one time in a deduplicated backup storage area, such as deduplicated data store 160. Also, if the piece of information does not change between a first backup and a second backup, then that piece of information will not be stored during the second backup as long as that piece of information continues to be stored in the deduplicated backup storage area. Data deduplication can also be employed outside of the backup context, thereby reducing the amount of active storage occupied by duplicated files.

Deduplication services can be implemented in the deduplication system 100 as a client-server application (not shown), with a server component (e.g., residing on deduplication server 140) and a client component (e.g., residing on client systems 110) of the client-server application. For example, during a backup process for storing a backup of user data 120 in deduplicated data store 160, a client component of the deduplication services can be configured to generate metadata 125 about user data 120, such as one or more identifiers, or signatures, that can identify different portions of user data 120, and to communicate metadata 125 to a server component, which is discussed further below. Certain functions of the deduplication services can be performed by the client and server components, where the functions may be divided between the two components, or may be performed completely by one component or the other, depending on the implementation of the backup application.

Deduplication server 140 is in turn coupled to network storage for deduplicated data that includes a deduplicated data store 160 and a metadata store 165. Deduplicated data store 160 is a storage area in which deduplicated data can be stored. Deduplicated data store 160 can be configured as single instance storage. In single instance storage, only a single instance of a piece of data is stored. A common use of single instance storage is for maintaining data backups for servers and other computing clients in a network. For each backup, only a single instance of information duplicated in deduplication system 100 will be stored in the single instance storage area. In addition, for subsequent backups occurring over time, data items that have not changed from one backup to another need not be stored in the subsequent backup. In this manner, significant savings in data storage space can be realized by eliminating duplicated data content.

Metadata store 165 is a storage area that includes various metadata regarding the deduplicated data stored in deduplicated data store 160, such as information regarding backup images stored in deduplicated data store 160 (also referred to herein as a catalog), including, in certain embodiments, references to the files included in a given backup. It is these references (e.g., file references) to which methods and systems such as those described herein are directed, with regard to improving the efficiency with which such references are managed. That being the case, metadata store 165 is configured with data constructs and structures, such as those described subsequently herein, in order to facilitate performance of processes such as those also described subsequently herein.

The various metadata (including metadata 125) can be stored in, among other locations, a central index. For example, deduplication server 140 can use metadata 125, such as the list of signatures from client systems 110, to determine if portions of a backup image (e.g., portions of user data 120) are non-duplicative of portions already stored in deduplicated data store 160. Once deduplication server 140 determines that a portion of user data 120 is not duplicative of the data already stored in deduplicated data store 160 and thus should be added to the deduplicated data store 160, deduplication server 140 can store a corresponding identifier, or signature, of the portion of user data 120 in the central index. Deduplication server can request the non-duplicative portions (or unique portions) from client systems 110 by identifying the unique portion with the portion's associated signature.

As the unique portions are received via a data stream from client systems 110, the unique portions can be written into a fixed-size container (e.g., also referred to herein as a container file, and includes these and/or other storage construct) stored at deduplication server 140, such as in a cache or other storage unit. Once the container is full of unique data segments, in certain embodiments, the entire container can be written to a location in deduplicated data store 160. The container written to the deduplicated data store 160 can also include a local container index, which indicates a local location of each unique portion stored within the container. The local container index can include a signature associated with each unique segment stored in the container, or alternatively can include a shortened version of the signature of each unique segment stored in the container. Deduplication server 140 can maintain information identifying a container (e.g., a container identifier (a "container ID")) of the container) in a central index as a location for each unique portion in the container. The signature of a unique portion can also be associated with the location of the unique portion in an entry of the central index, where the central index includes an entry for each portion stored in the deduplicated data store 160. Thus, an identification of a portion's location, or a container ID, can be found in the central index by using the signature of the portion as a key in the central index. The location of the portion within the container identified by the container ID can be found in the local container index of the container by using at least a part of the signature as a key in the local container index.

Multiple backup images can be stored in the deduplicated data store 160. For example, a first backup image can be captured from user data 120 and can be stored in deduplicated data store 160. A subsequent backup image captured from user data 120 can include duplicate portions that are identical to portions of the first backup image already stored in deduplicated data store 160 and can include unique portions that are not identical to portions of the first backup image (e.g., portions that correspond to changed user data 120). The unique portions of the subsequent backup image can be written to deduplicated data store 160, while the duplicate portions will not be written (since the duplicate portions are identical to instances of portions already stored in deduplicated data store 160). Since only single instances of portions of a backup image are stored in deduplicated data store 160, metadata store 165 can provide a mapping of a backup image to the various non-duplicative portions stored in deduplicated data store 160 that compose the backup image. Thus, a single backup image can be associated with multiple portions stored throughout the deduplicated data store 160, and multiple backup images can be associated with a single portion (e.g., the multiple backup images share the single portion). For example, the subsequent backup image can be associated with unique portions of the subsequent backup image that were written to deduplicated data store 160 and with unique portions of the first backup image that were previously written to the deduplicated data store 160. Metadata store 165 can store associations between a backup image and the portions that compose the backup image as a group of references or pointers, where each reference indicates an entry of the central index that corresponds to a portion included in the backup image.

As additional backup images are added to deduplicated data store 160, backup image data can become fragmented across deduplicated data store 160 as portions of changed user data 120 are stored. Thus, a recent backup image stored in deduplicated data store 160 may include portions of recently changed user data 120 contiguously located in deduplicated data store 160, and may include multiple references to previously changed user data associated with older backup images, which are stored in various non-contiguous locations throughout deduplicated data store 160. If a user were to restore the recent backup image from deduplicated data store 160, deduplication server 140 would have to read numerous portions of data associated with older backup images from across the various locations (e.g., various containers) in deduplicated data store 160. Thus, as a backup image becomes more fragmented, restoration of the backup image can become more inefficient due to the increasing amount of time spent on performing a growing number of access operations needed to read each portion of data of the backup image from various locations in deduplicated data store 160 (e.g., determining a location for each of the multiple portions from metadata store 165).

Deduplicated data store 160 and metadata store 165 can be stored in network storage. Network storage can be implemented as network attached storage (NAS), file servers, storage filers, and/or network shares. Network storage can be implemented as a single storage device or as a collection of storage devices. Network storage can also be implemented as a storage area network (SAN), which couples remote storage devices to a server (e.g., a storage server), such that the remote storage devices appear as locally-attached storage devices to the server's operating system (OS), for example. Network storage can include a data volume.

In light of the present disclosure, it will be appreciated that network storage can be implemented by any type of computer-readable storage medium, including, but not limited to, internal or external hard disk drives (HDD), optical drives (e.g., CD-R, CD-RW, DVD-R, DVD-RW, and the like), SSD and/or FLASH memory drives (e.g., USB memory sticks and the like), tape drives, removable storage in a robot or standalone drive, and the like. Alternatively, it will also be appreciated that, in light of the present disclosure, deduplication system 100 and network 105 can include other components such as routers, firewalls and the like that are not germane to the discussion of the present disclosure and will not be discussed further herein. It will also be appreciated that other configurations are possible. For example, client systems 110 can be directly coupled to deduplicated data store 160 and/or metadata store 170, and so on.

The letter N is used to indicate a variable number of devices or components. For example, a variable number of clients are implemented in the deduplication system. Although the letter N is used in describing a variable number of instances of each of these different devices and components, a repeated use of the letter N does not necessarily indicate that each device and component has a same number of N instances implemented in the deduplication system.

Figure 2:
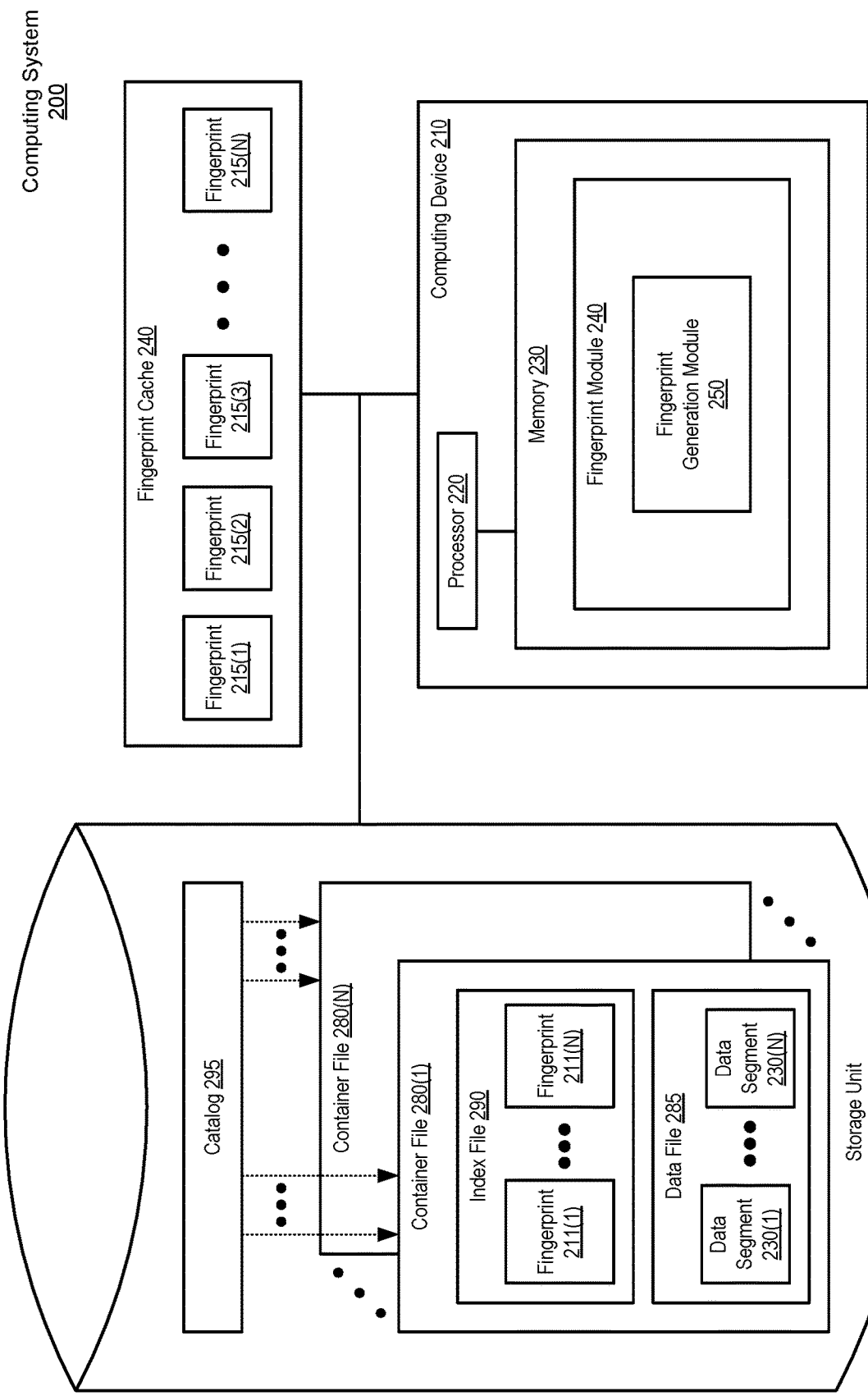
FIG. 2 is a simplified block diagram illustrating components of a computing system supporting deduplication, according to embodiments of methods and systems such as those disclosed herein.

FIG. 2 is a block diagram of a computing system (which can be a client computing system or a server computing system, and which is depicted in FIG. 2 as a computing system 200). Computing system 200 includes a computing device 210, a storage unit 270, and a fingerprint cache 240. As will be appreciated in light of the present disclosure, a fingerprint cache such as fingerprint cache 240, in certain embodiments, facilitates a determination as to whether data represented by a given fingerprint is stored in the system, as well as facilitating the identification of the container file in which the data in question (i.e., that represented by the given fingerprint) is stored. As shown, computing device 210 is communicatively coupled to storage unit 270 and fingerprint cache 240. Computing device 210 can be implemented using one or more of a variety of different types of computing devices, including a server, personal computing device, laptop computer, net book, personal digital assistant, cellular phone, or the like. It is noted that this is a simplified example, and that other embodiments can include far more complex organizational and configuration schemes than are shown here.

Computing device 210 includes a processor 220, and memory 230. Computing device 210 also includes a fingerprint module 240 which implements a fingerprint generation module 250. Fingerprint generation module 250 generates new fingerprints for a given data segment by implementing, for example, a fingerprint generation routine that generates a hash value corresponding to the given data segment. In this example, fingerprint generation module 250 implements a routine that uses a fingerprinting algorithm to generate a fingerprint (hash value).

Storage unit 270 stores a number of container files (e.g., such as one of container files 280(1)-(N), referred to herein for the sake of simplicity as container file 280, as an example of a container file and/or other such storage constructs) which includes a data file 285 and an index file 290. In this example, index file 290 stores fingerprints (e.g., fingerprints 211(1)-(N)) and data file 285 stores data segments (e.g., data segments 230(1)-(N)). Fingerprint cache 240 is a dedicated cache for storing fingerprints (depicted in FIG. 2 as fingerprints 215(1)-(N)). As will be appreciated in light of the present disclosure, the fingerprints stored in fingerprint cache 240 can represent data objects generally (e.g., data storage constructs such as files and the like).

Computing device 210 is coupled to storage unit 270. In this example, storage 270 stores container file 280, but can also store data (not shown) in addition to container file 280, and can do so using other formats. Storage 270 can be a persistent storage device and can include one or more of a variety of different storage devices, including hard disks, compact discs, digital versatile discs, solid state drives (SSDs; e.g., FLASH memory), and the like, or one or more logical storage devices such as volumes implemented on one or more such physical storage devices.

Computing device 210 is also coupled to a fingerprint cache 240. In this example, fingerprint cache 240 can be main memory, an SSD, or even a file, and implements a cache such that data (e.g., frequently accessed fingerprints) can be served to computing device 210 in an expeditious manner to determine the existence of a given fingerprint and where the data represented by that fingerprint is stored, versus, for example, from a slower storage device (e.g., a hard disk drive (HDD)). However, fingerprint cache 240 can be implemented on one or more of a variety of different storage devices, including hard disks, compact discs, digital versatile discs, and the like, or on one or more logical storage devices such as volumes implemented on one or more such physical storage devices.

Computing device 210, storage unit 270, and fingerprint cache 240 can be integrated (e.g., where the storage device is coupled to the node's internal processing devices by an internal bus and is built within the same chassis as the rest of the node) or separate. If separate, computing device 210, storage unit 270, and fingerprint cache 240 can be coupled by a local connection or via one or more networks (e.g., local area networks (LANs) and/or wide area networks (WANs) (not shown)).

FIG. 2B is a block diagram of a computing system that stores multiple fingerprints and their associated data segments in a container file. In such a deduplication backup system (depicted in FIG. 2B as deduplication system 201), data storage constructs such as data segments (e.g., data segments 230(1)-(N)) are depicted as being stored in a data file (e.g., such as data file 285) of container file 280(1). Each container file includes an index file (e.g., such as index file 290) and a data file (e.g., such as data file 285). In this example, index file 290 stores fingerprints 211(1)-(N) and data file 285 stores data segments 230(1)-(N). In the embodiment depicted in FIG. 2B, each of fingerprints 211(1)-(N) corresponds to a corresponding one of data segments 230(1)-(N). Also as shown in FIG. 2B, fingerprint cache 241 stores fingerprints 215(1)-(N). For example, after data segments and their associated fingerprints are stored in a container file 280, fingerprint cache 241 can be maintained to indicate that the data segment in question is stored in a container file 280 (and so is a duplicate).

As before, fingerprints 215(1)-(N) represents data storage constructs generally (e.g., the aforementioned data segments, and/or files or the like). In a deduplication backup systems that implement fingerprints, an index file can be employed to separately record fingerprint information, data segment location, and data segment size for each unique fingerprint associated with a data segment (e.g., <fp1, size1, offset1>, <fp2, size2, offset2>, and so on, as described, for example, in connection with FIG. 4, subsequently). Also, the index file may include other information about the data segments, including (but not limited to) information indicating whether the data segment is compressed, encrypted, and/or has other such characteristics that may need to be taken into account when accessing that data segment.

Deduplication system 201 can include, for example, a deduplication management module 296 to manage various of the aforementioned information. For example, deduplication management module 296 can manage insertion of fingerprints in index file 290, data segments in data file 285, storage of fingerprints in fingerprint cache 241, and references and other information in catalog 295. Further in this regard, deduplication management module 296 can perform or cause to be performed deduplication management operations such as those described elsewhere herein.

FIG. 3 is a simplified block diagram illustrating an example of the composition of container file 280, which, according to one or more embodiments, allows a backup operation to reference multiple fingerprints representing the data segments that make up a given data construct, such as a file. At the beginning of an initial backup operation, new data segments are written into the given container files (e.g., a container such as container file 280). At the end of the initial backup operation, a data object is stored in the newly-created container file. The data object can contain, for example, the following information: <fp1, size1, containerID1>, <fp2, size2, containerID2>, and so on. A data object typically corresponds to a backup image that includes the data segments to be backed up during a full or incremental backup operation. As will be also appreciated in light of the present disclosure, a data object may be represented by a fingerprint that is the hash value of the data object content.

According to one embodiment, at the beginning of a backup operation from the same client and/or backup policy that performed and/or requested the initial backup operation, data objects that include fingerprints of the last full backup operation (in this example, the initial backup operation) can be retrieved from container file 280. Data segments (or other data storage constructs, as noted) in the new backup operation are fingerprinted (e.g., using fingerprint generation module 250) and looked up within fingerprints from the last full backup operation (e.g., fingerprints 215(1)-(N) in fingerprint cache 240).

If a given fingerprint is not among fingerprints 215(1)-(N) in fingerprint cache 240, a "cache miss" has occurred, and such as indicated (thereby indicating that one or more fingerprints thus generated were not present in the last full backup operation). That being the case, such fingerprints are looked up in a fingerprint index cache, which, in certain embodiments, is a centralized fingerprint index cache such as that depicted in connection with FIG. 2B. In certain embodiments, if the fingerprints are not found in such a central fingerprint index cache, the fingerprints are inserted into the central fingerprint index cache. Future backup operations can then reference fingerprints from both the last full backup operation (e.g., an initial backup operation) and the new backup operation.

In some embodiments, such a central fingerprint index cache is maintained by a deduplication server. In such a scenario, the central fingerprint index cache includes at least part of the entire set of fingerprints that exist in the deduplication system and includes fingerprints generated by a fingerprinting algorithm such as that described previously herein. Although future backup operations can reference fingerprints from the previous backup operations, the central fingerprint index cache will typically not maintain copies of all the fingerprints making up fingerprints 215(1)-(N) because, in this example, fingerprint cache 240 is implemented on an SSD. While such an implementation provides faster fingerprint retrieval and lookup functions, such a storage technology does not typically provide enough storage to store all the fingerprints associated with the various data segments in the previous backups. Therefore, index file 290 is needed, to ensure that future backup operations can reference index file 290 (rather than having to store all such fingerprints in fingerprint cache 240).

FIG. 4 is a simplified block diagram illustrating an example of the composition of index file 290 and data file 285, according to one or more embodiments. That being the case, index file 290 can be seen to include a number of metadata entries (depicted in FIG. 4 as metadata entries 297(1)-(N), and referred to in the aggregate as metadata entries 297), which, in turn, include: <FP1, size1, offset1>, <FP2, size2, offset2>, and so on, where FP1 represents fingerprint 211(1), FP2 represents fingerprint 211(2), and so on. Metadata entries 297 are shown in an example as a segment metadata entry 298, which includes a fingerprint, a data segment size, and a data segment offset within data file 285. While metadata entries 297 are depicted as including such information, additional information (e.g., compression/encryption flags, a checksum, other data references, and/or other relevant information pertinent to the data stored in data file 285). Index file 290 also includes a header 299, which can be used to maintain information regarding the aforementioned metadata entries. As is shown in FIG. 4, the size and offset information, associated with each of the fingerprints, serves as an index to a data segment in data file 285 to which the given fingerprint corresponds.

In some embodiments, index file 290 includes a number of data object records, each of which may include, in addition to the foregoing, a unique identifier (UID) list, which may list one or more UIDs of file records in catalog 295, as described subsequently in connection with FIG. 4. When a file's data is to be inserted in the catalog (e.g., as part of a backup operation), a file record is created with a UID for the file and fingerprint for the data of the file. In such embodiments, the given UID can be inserted into the data object record that has the data fingerprint in question (i.e., the fingerprint of the data object storing some or all of the file data of the inserted file). When a file record is removed (e.g., in response to a request from a source computer), the UID of that file record is also removed from the corresponding data object record. Thus, in such embodiments, the UID list of a data object record uniquely identifies each file to which file data corresponds.

Figure 5:
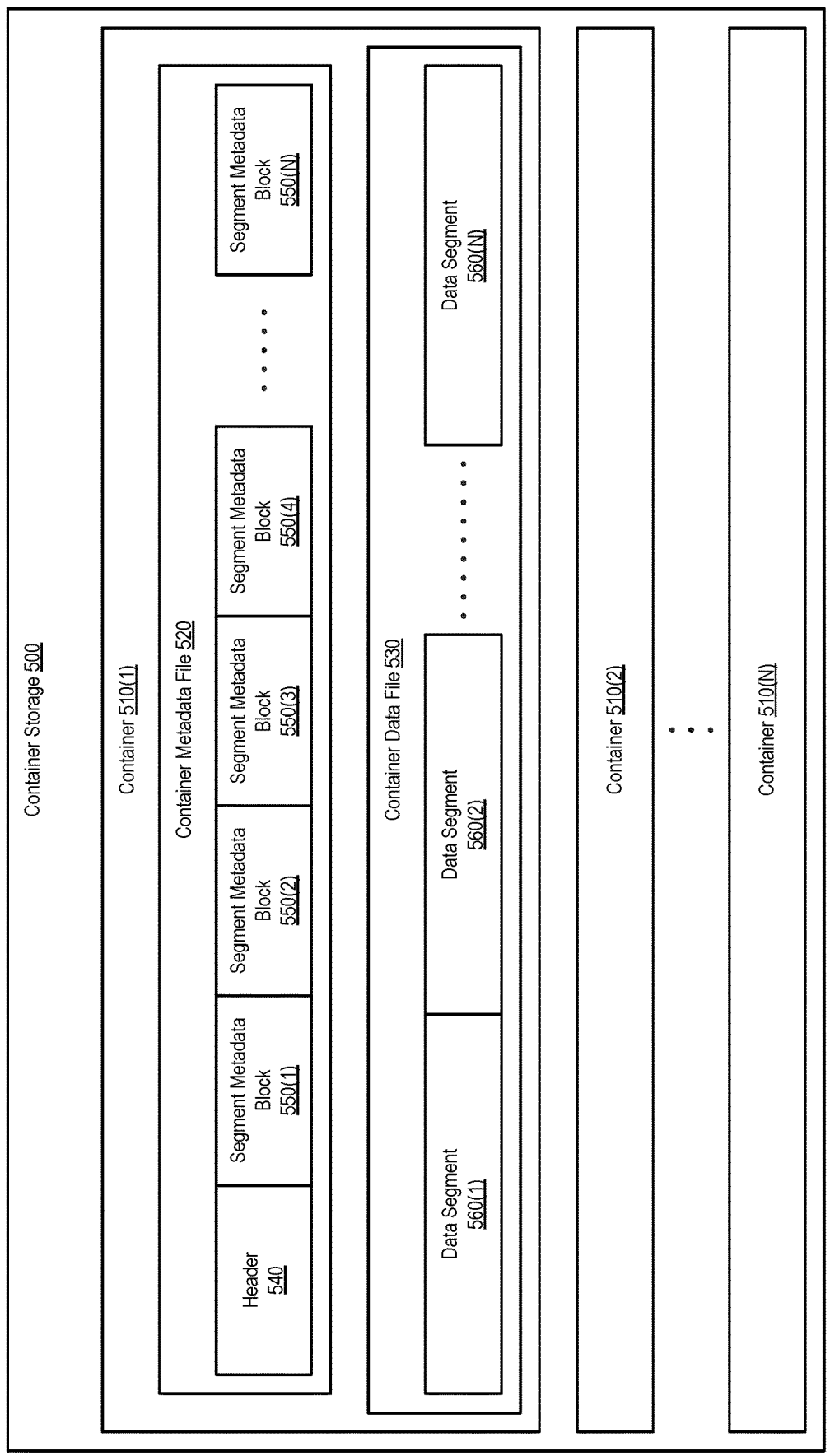
FIG. 5 is a simplified block diagram illustrating an example of container storage and containers therein, according to methods and systems such as those described herein.

FIG. 5 is a simplified block diagram illustrating an example of container storage, according to methods and systems such as those described herein. FIG. 5 thus depicts an example of container storage 330 as container storage 500 and, in so doing, provides greater detail as to the information stored therein. Container storage 500 provides for the storage of a number of containers (depicted in FIG. 5 as containers 510(1)-(N), and referred to in the aggregate as containers 510). While container storage 500 is depicted in FIG. 5 in a conceptual manner, in one embodiment, each of containers 510 can be implemented as one or more files in a file system such as those noted previously herein. Further detail is provided in connection with container 510(1). Container 510(1) is depicted as including a container metadata file 520 and a container data file 530. Container metadata file 520, in turn, includes a header 540 and some number of segment metadata blocks (depicted in FIG. 5 as segment metadata blocks 550(1)-(N), and referred to in the aggregate as segment metadata blocks 550). As will be appreciated in light of the present disclosure, segment metadata blocks 550 are comparable in content and structure to metadata entries 297(1)-(N), and are intended to be interchangeable therewith. Container data file 530 includes a number of data segments (depicted in FIG. 5 as data segments 560(1)-(N), and referred to in the aggregate as data segments 560).

Example Techniques for Efficient Storage in Erasure-Coded Storage Environments

As noted previously, embodiments such as those described herein can be used, for example, in the context of data deduplication (or more simply, deduplication), which can employ such embodiments to efficiently write data and metadata produced thereby. In light of the aforementioned issues that can be experienced in erasure-coded storage systems, methods and systems such as those described herein provide improved write performance by, in general terms, distinguishing between different information types (e.g., data and metadata, as when storing deduplicated data, for example, as from a backup). In so distinguishing, methods and systems such as those described herein provide such improved write performance while maintaining the integrity of the data and metadata in question, albeit by different techniques. Such an approach improves write performance by journaling only the metadata (e.g., a container's metadata) and storing the associated data in a manner that prevents data corruption without journaling that data. Further details in this regard, as well as advantages thereof, are now described.

Figure 6A:
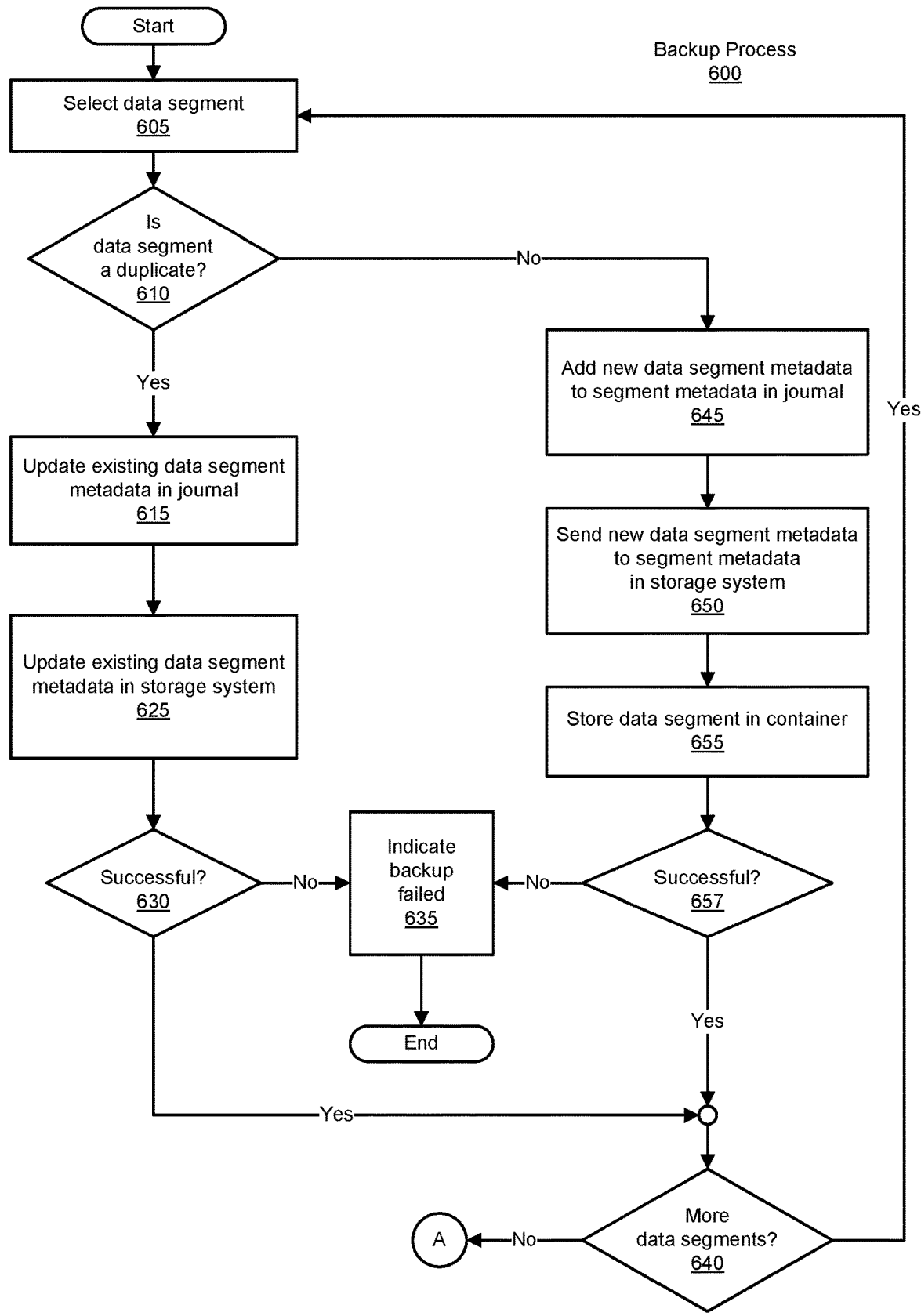
FIGS. 6A and 6B depict a flow diagram illustrating an example of a process for performing a deduplicated backup operation, according to embodiments of methods and systems such as those disclosed herein.
Figure 6B:
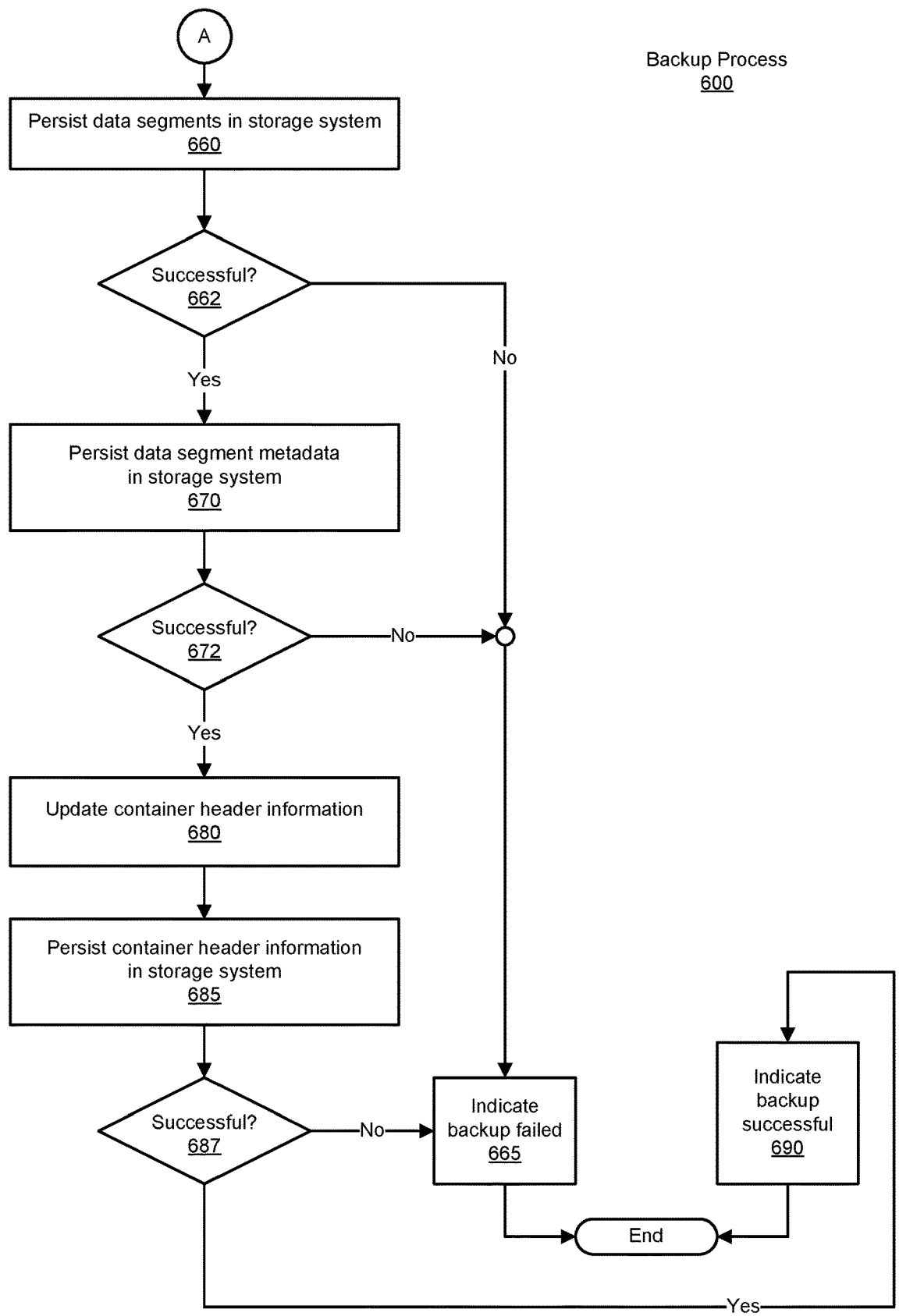

FIGS. 6A and 6B depict a flow diagram illustrating an example of a process for performing a deduplicated backup operation, according to embodiments of methods and systems such as those disclosed herein. That being the case, a deduplicated backup process 600 (or more simply backup process 600) is depicted. Backup process 600 begins with the receipt of an indication that a deduplicated backup is to be performed (not shown). If no such event has occurred, backup process 600 iterates, awaiting the occurrence of such an event. In response to a determination that a backup operation is to be performed, the data that is the subject of the backup operation is divided into a number of data segments. Each of these data segments can be represented by a fingerprint, as noted. To allow the present discussion to focus on the salient features of the embodiments described herein, backup process 600 depicts a simpler deduplication process then might otherwise be implemented. For example, caching of fingerprints at a client or server can be implemented, as can a number of techniques directed to improving backup operation performance.

With that in mind, backup process 600 begins with the selection of one of the data segments to be backed up (605). A determination is then made as to whether the data segment in question is a duplicate (610). If the data segment in question is a duplicate (and so, a duplicate data segment has already been stored), the corresponding data segment metadata stored in the journal is updated (615). Next, existing data segment metadata stored in the storage system is updated (625). A determination is made as to whether these operations were successful (630).

If the operations associated with updating the data segment's metadata were unsuccessful (e.g., some manner of failure was encountered), an indication to the effect that the attempted backup has failed is made (635). Backup process 600 then concludes. It will be appreciated that, as discussed subsequently, the indication of a failed backup may be used to prompt another attempt to backup the data in question.

If the operations associated with updating the data segment's metadata were successful, however, backup process 600 proceeds to a determination as to whether more data segments remain for deduplication (640). If further data segments remain for deduplication, backup process 600 loops to the selection of the next data segment (605) and backup process 600 continues. Alternatively, if the data in question has been deduplicated (640), backup process 600 proceeds to the remainder of that process by way of connector "A" to the process depicted in FIG. 6B.

Returning to the determination as to whether the data segment in question is a duplicate (610), if that determination indicates that the data segment in question is not a duplicate, backup process 600 proceeds with adding new data segment metadata (i.e., a new segment metadata block) to the copy of the container metadata stored in the journal (645). This new data segment metadata is also sent to the storage system for storage as a new segment metadata block in the container metadata (650).

As before, a determination is made as to whether the foregoing storage operations were successful (657). In the case in which these operations encountered a failure, an indication to that effect is made (635) and backup process 600 concludes. Alternatively, if the storage operations were successful, backup process 600 proceeds with making a determination as to whether further data segments remain to be deduplicated (640). As before, if further data segments remain, backup process 600 loops to the selection of the next data segment (605) and backup process 600 proceeds with the processing of that data segment. In the alternative, if no further data segments remain, backup process 600 proceeds to the remainder of that process by way of connector "A" to the process depicted in FIG. 6B.

FIG. 6B depicts the remainder of backup process 600. Beginning with connector "A", backup process 600 proceeds with persisting the (deduplicated) data segments in the storage system (660). As before, a determination is made as to whether this operation was successful (662). If the operation was unsuccessful, an indication that the backup operation has failed is provided (665). As before, in such a situation, backup process 600 then concludes. It will be appreciated in light of the present disclosure that the failure of such a backup operation is tolerable with regard to data integrity because such a failure will be evident to the application software requesting the backup. In this regard, such an operation is transactional in nature, and so will not result in such application software's proceeding on the (erroneous) basis that such a transactional operation was successful, when such is not the case (or otherwise becomes so). IT will be further appreciated that the persisting of the data segments begins on an EC stripe boundary, as is discussed elsewhere herein. It will also be appreciated that, while such boundary may be on an extent boundary, such need not be the case (e.g., in the situation in which an extent covers multiple EC stripe units). Further still, as is noted elsewhere herein, in the persisting of multiple data segments in a data span, while the data span (e.g., the first data segment of the data span) will begin on an EC stripe boundary, the remaining constituent data segments need not be so aligned.

If the backup's data segments were successfully persisted to the storage system, backup process 600 proceeds with the persisting of data segment metadata (segment metadata blocks) in the storage system parentheses 670). Once again, a determination is made as to whether the operation in question was perform successfully (672). Also as before, if the operation was not perform successfully, an indication to this effect is provided (665) and backup process 600 concludes.

In the alternative, if the data segment metadata in question was successfully persisted to the storage system, container header information is updated (680) and is persisted to the storage system (685). Again, a determination is made as to whether the operations related to the given container header information were successful (687). If these operations were unsuccessful, an indication to this effect is provided (665) and backup process 600 concludes. Alternatively, if the operations related to saving the container header information were successful, an indication that the backup operations of backup process 600 were successful is provided (690) and backup process 600 concludes. In certain embodiments (and in fact, generally), an indication that a backup operation was unsuccessful (i.e., failed) will result in the backup operation being reattempted, though that need not strictly be the case. However, it will be appreciated that, in employing an approach such as that depicted as backup process 600, data integrity can be maintained when such a process is implemented using traditional storage systems (e.g., RAID arrays and the like).

Figure 7:
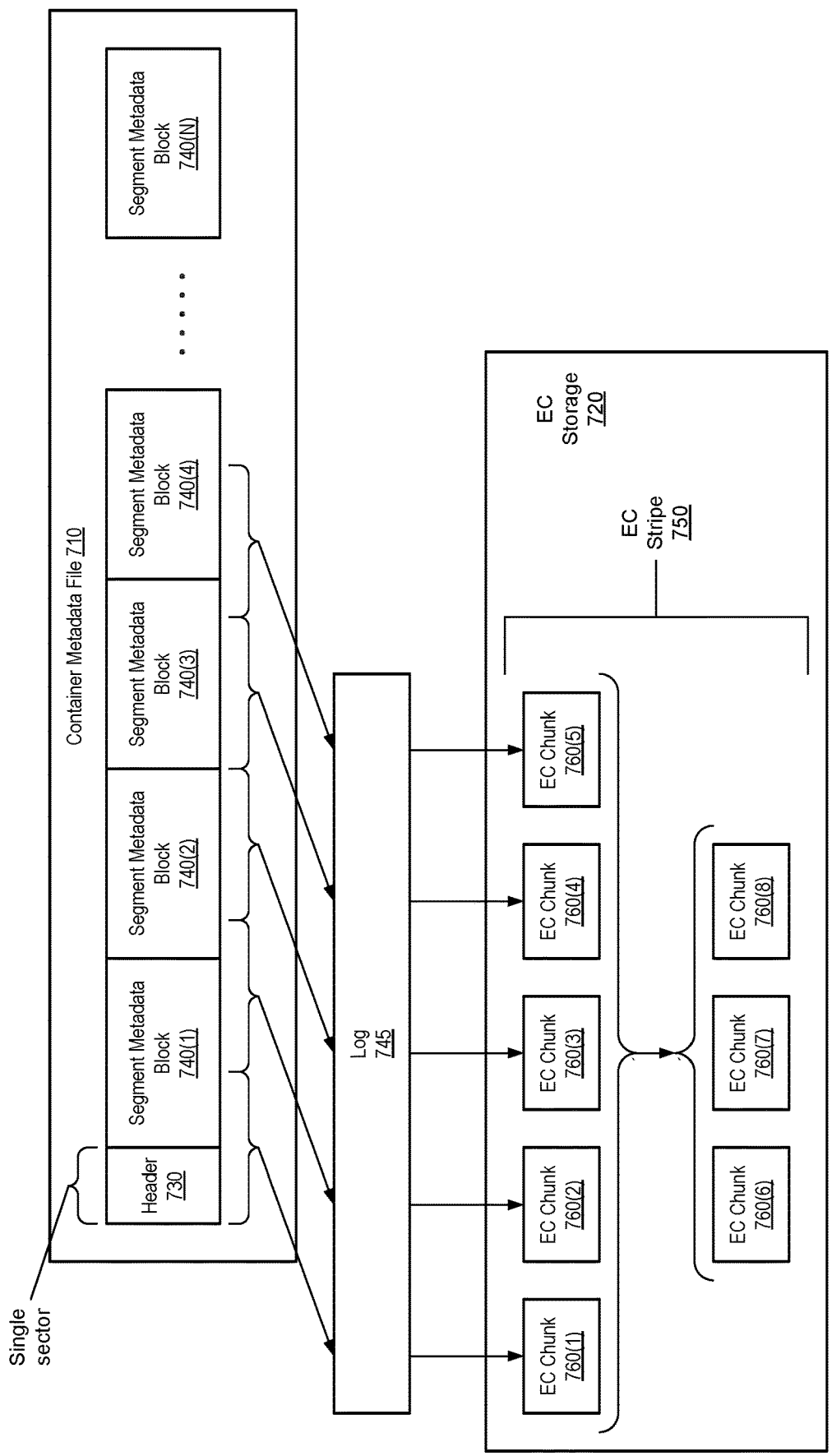
FIG. 7 is a simplified block diagram illustrating an example of a container metadata file and its storage, according to embodiments of methods and systems such as those disclosed herein.

Example Techniques for Efficient Writing of Information in Erasure-Coded Storage FIG. 7 is a simplified block diagram illustrating an example of a container metadata file and its storage, according to embodiments of methods and systems such as those disclosed herein. That being the case, FIG. 7 depicts a container metadata file 710 and its storage in erasure-coded storage 720 (though, as noted throughout the present disclosure, other sufficiently-reliable storage, such as n-way mirrored storage, can be employed). Container metadata file 710 includes a header 730, as well as a number of segment metadata blocks (depicted in FIG. 7 as segment metadata blocks 740(1)-(N), and referred to in the aggregate as segment metadata blocks 740). Metadata such as is stored in container metadata file 710 is stored in a log or otherwise journaled (which is depicted in FIG. 7 as such metadata being written to a log 745, which can be implemented, for example, as a circular log). As depicted in FIG. 7, metadata written to log 745 (e.g., the various portions of container metadata file 710) is then flushed to (written to and stored in) storage (which can be EC storage (ECS)) 720 as a number of EC stripes (an example of which is depicted in FIG. 7 as EC stripe 750). As noted earlier, by journaling metadata, a failure in writing such information to the appropriate EC stripe and other issues can be tolerated, and problems addressed by again flushing of the information in question from log 745 to the journaled storage unit. Once the storage system indicates that the information has been successfully stored, that information can be deleted from log 745 (e.g., in the case of a circular log, updating the appropriate pointer to indicate that the storage space occupied by the successfully-written information is now available for the storage of new information being logged (journaled)). As is also depicted, metadata such as header 730, segment metadata blocks 740(1)-(3), and a first portion of segment metadata block 740(4) are stored in EC stripe 750 as a number of EC chunks, those being EC chunks 760(1)-(8) (using, in this example, a ⅝ erasure code).

It will be appreciated that such journaled storage is intended only as an example, and no particular relationship between the amounts of storage consumed by any of these elements is necessarily intended to be conveyed (e.g., it is not uncommon, in terms of the amount of storage space consumed by such elements, for a header's storage space requirements to be significantly less than that of a segment metadata block, or the ratio storage space consumed as between a segment metadata block and its associated data segment to be at a ratio of 1:100, 1:250, 1:500, or higher, for example, though such need not necessarily be the case). In view of this, as is represented in FIG. 7, EC chunks 760(1)-(5) are original data and are taken as inputs by the erasure coding process to produce EC chunks 760(6)-(8). Further, the generation of parity information is depicted in FIG. 7 as occurring as part of the writing of metadata to EC chunks 760(1)-(5). Such an approach obviates the need to journal such parity information (i.e., store parity information in log 745). Alternatively, however, parity information can, in certain embodiments, be calculated when the metadata is stored in log 745. While such an approach consumes more storage space in log 745, calculation of the parity information need only be performed once, even in the event of a failure in flushing the information in log 745 to EC storage 720. Further still, it is to be appreciated that the storage shown in FIG. 7 as EC storage 720 (and, so, EC chunks 760 of EC stripe 750) is merely an example of the type of storage that can be employed to store information such as that in container metadata file 710.

Moreover, as is noted elsewhere, EC storage 720 can, in fact, be implemented using any sufficiently-reliable storage type, including not only EC storage, but also non-EC storage, in any appropriate combination. For example, n-way mirrored, RAID 0 through RAID 6, nested RAID, and other sufficiently-reliable storage methods can be employed. Such flexibility is facilitated by the fact that the storage of information in the journaled storage is, as will be appreciated, written to a log, prior to the log being flushed to that storage system in question (i.e., is journaled). Such journaling provides for more robust storage of such information, as noted in connection with the example of EC storage described earlier.

Further still, in fact, if the underlying storage is sufficiently reliable (e.g., mirrored storage), the metadata (as well as other information to be stored in such storage) can be stored without journaling, and so, the metadata (and other information) in question can be written directly to such storage. That being the case, journaling can be employed (or not) depending on the level of reliability provided by the underlying storage type and the sufficiency of that reliability in the given circumstances. In addition to the sufficiency of the underlying storage's reliability, other factors to be considered in this regard can include the amount of available storage space of the underlying storage type, its cost, the level of storage space efficiency needed/provided thereby, access to that storage type for operations such as replication, likelihood of overflow of non-journaled EC storage (and so the ability to store/costs involved in storing data in such storage) and the performance needed/provided in that regard, and other such factors. That being the case, variations as to the storage type of such storage, and whether or not such storage is journaled, is intended to be comprehended by the components described herein, notwithstanding the terminology used regarding such components.

In the case of EC storage, as will be appreciated, given that the information in container metadata file 710 is journaled, storage of the information in container metadata file 710 can be performed in a transactional manner (as a single transaction that succeeds or fails as a unitary operation) by ensuring that such information is written starting on an EC stripe boundary. In other words, with segment metadata blocks being journaled, the writing of segment metadata blocks can be treated as a transaction, and result in either success or failure (and if failure, be re-attempted). In so doing, if there is a failure during the flushing of the journal to EC storage, such flushing can be re-attempted. Further, given that the storage of a header can also be performed transactionally (based on its size guaranteeing the operation's atomicity), data corruption due to node or network failure, for example, can be avoided.

It will also be appreciated that the storage of each of EC chunks 760(1)-(8) in separate storage devices, storage nodes, or other such storage units of the storage system in question results in the ability of EC stripe 750 to tolerate a failure in up to three such storage devices/nodes, while still providing for the recovery of the original data. Also noted in FIG. 7 is the fact that, in this embodiment, header 730 can be stored in a single sector of the storage system, in order to allow its storage to be performed as an atomic operation.

Figure 8:
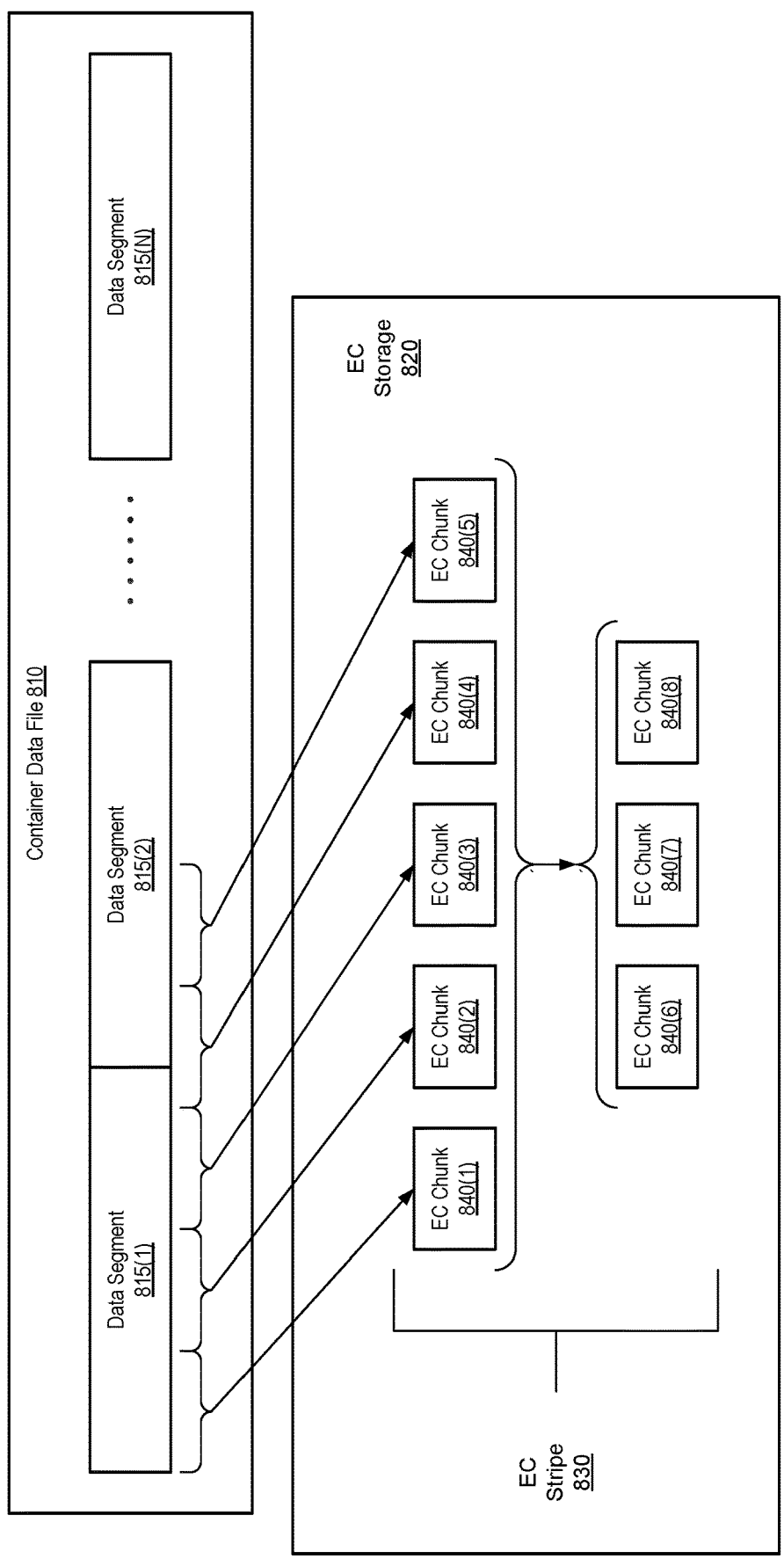
FIG. 8 is a simplified block diagram illustrating an example of a container data file and its storage in erasure-coded storage, according to embodiments of methods and systems such as those disclosed herein.

FIG. 8 is a simplified block diagram illustrating an example of a container data file and its storage in erasure-coded (EC) storage, according to embodiments of methods and systems such as those disclosed herein. In a fashion comparable to the erasure-coded storage depicted in FIG. 7, FIG. 8 depicts a container data file 810, which includes a number of data segments (depicted in FIG. 8 as data segments 815(1)-(N), and referred to in the aggregate as data segments 815). Also depicted in FIG. 8 is EC storage (ECS) 820, in which data segments 815 are stored. For example, data segment 815(2) is depicted as being stored in an EC stripe 830. EC stripe 830 is made up of a number of EC chunks, which are depicted in FIG. 8 as EC chunks 840(1)-(8) (and which are referred to in the aggregate as EC chunks 840). As noted with regard to container metadata file 710, it will be appreciated that such storage is intended only as an example, and no particular relationship between the amounts of storage consumed by any of these elements is necessarily intended to be conveyed (e.g., while the data of data segment 815(1) and a portion of data segment 815(2) are shown as mapping to EC chunks 840(1)-(5), such need not be the case—such EC chunks and data segments can be in any ratio to one another, for example). Thus, data segments 815 could map to any number of EC stripes, depending on the configuration of container data file 810 and EC storage 820.

Further in this regard, the creation of container data file 810 presents no issues, given that container data file 810 (and so, data segments 815) can be forced to begin on an EC stripe boundary. In the manner noted earlier, such a storage operation can be treated as transactional in nature (as a single transaction that succeeds or fails as a unitary operation), to the same effect. In order to accomplish this, embodiments such as those described herein take certain steps to ensure the integrity of data being stored, as noted. For example, a storage policy can be configured for such non-journaled volumes, to store data (e.g., data extents or the like) in a manner that aligns such data on EC stripe boundaries. Further, such a storage policy is preferably configured such that data extents are an integer multiple of stripe lengths in length. Given that such data is treated as WORM data, the use of storage objects, container data files, or other such construct can be employed. In such implementations, the failure of a write operation simply results in the construct being deleted (deleted, deallocated, reclaimed, or otherwise removed from use). The original construct (in which the data in its original state is stored), including both data and parity chunks, remains available for use, and the deleted construct is not made available to be read. In addition, when performing write operations on data, the data written is divided into whole and/or partial EC stripe lengths when written to storage. In one embodiment, the resulting partial stripe (if any) is written first, followed by the writing of one or more full stripes' worth of metadata/other information (again, if any). As will be appreciated, this may result in the last data written filling only a partial EC stripe.

Figure 9A:
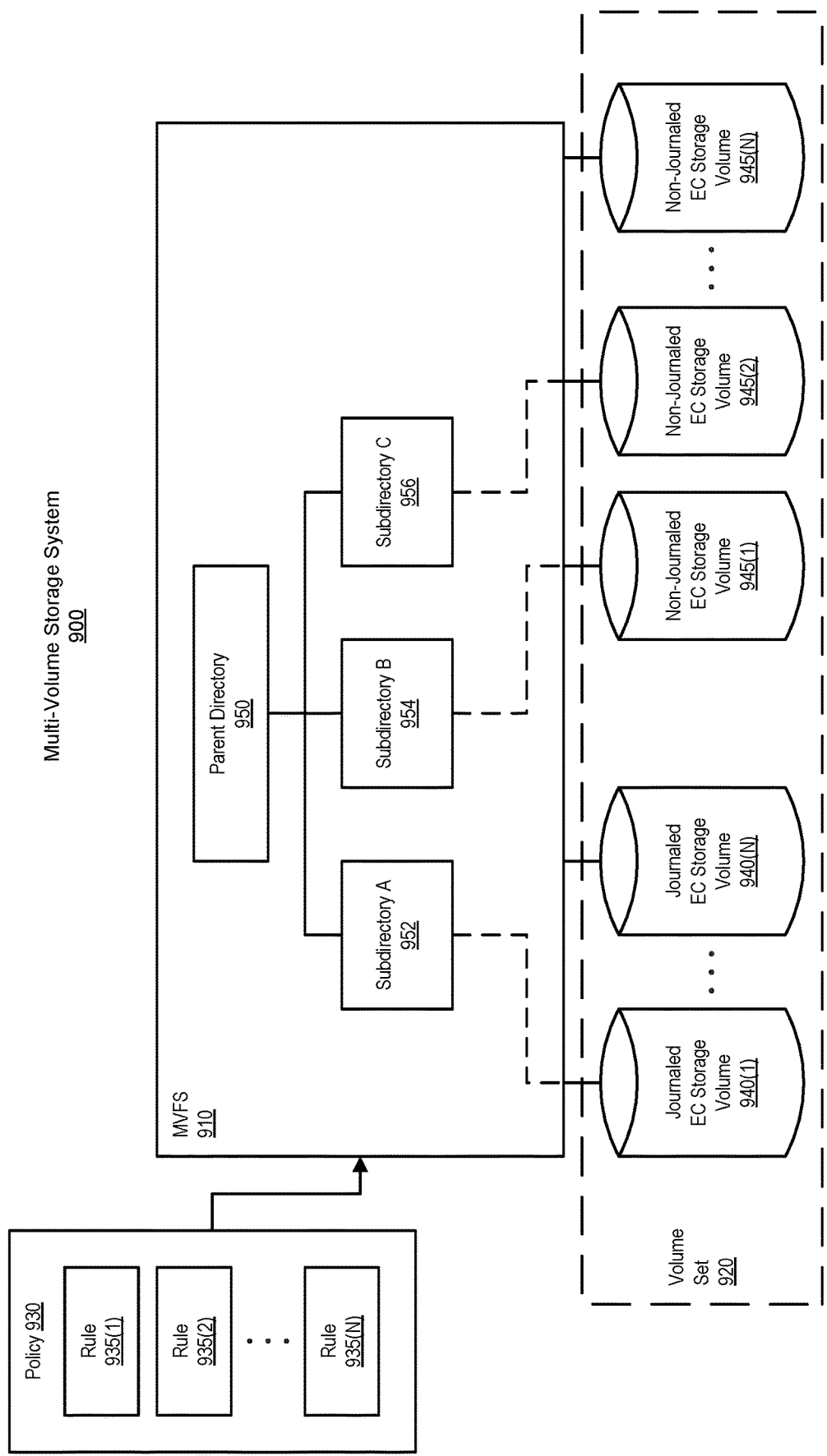
FIG. 9A is a simplified block diagram illustrating an example of a multi-volume storage system, according to embodiments of methods and systems such as those disclosed herein.

FIG. 9A is a simplified block diagram illustrating an example of a multi-volume storage system, according to embodiments of methods and systems such as those disclosed herein. That being the case, FIG. 9A depicts a multi-volume storage (MVS) system 900. MVS system 900 includes a multi-volume file system (MVFS) 910 that provides logical access to a number of volumes in a volume set 920. MVFS 910 can be managed, at least in part, using an administrative interface that allows one or more policies for MVFS 910 to be configured. An example of such a policy is depicted in FIG. 9A as a policy 930, which includes a number of rules to be applied to the operation of MVFS 910, during its operation, and which are depicted in FIG. 9A as rules 935(1)-(N) (referred to in the aggregate as rules 935).

The volumes in volume set 920 include, in one embodiment, a number of journaled EC storage volumes (examples of which are depicted in FIG. 9A as journaled EC storage volumes 940(1)-(N), and which are referred to in the aggregate as journaled EC storage volumes 940) and non-journaled storage volumes (examples of which are depicted in FIG. 9A as non-journaled EC storage volumes 945(1)-(N), and which are referred to in the aggregate as non-journaled EC storage volumes 945). It is to be appreciated that the volumes in volume set 920 are merely representative in nature, and so are intended to comprehend not only logical volumes or other such storage units (whether physical or virtual), but also the physical or virtual storage devices that underlie such storage units. And once again, it should be observed that, while discussed in terms of EC storage, journaled EC storage volumes 940 can, in fact, employ any sufficiently-reliable storage type, alone or in appropriate combination, and in so doing, one or more thereof, in fact, not employ journaling in appropriate circumstances (notwithstanding the terminology used herein).

MVFS 910 provides file system functionality for various uses thereof. For example, MVFS 910 can support a directory tree such as that depicted in FIG. 9A. Such a directory tree can include a parent directory (an example of which is depicted in FIG. 9A as a parent directory 950), which, in turn, has a number of subdirectories (examples of which are depicted in FIG. 9A as a subdirectory A 952, a subdirectory B 954, and a subdirectory C 956). Given that MVFS 910 is a multi-volume file system, the various directories and subdirectories of MVFS 910 (the latter of which are simply directories with parent directories) can be mapped to various of the volumes of volume set 920, based, at least in part on rules such as rules 935 of policy 930. That being the case, in the example presented in FIG. 9A, rules 935 of policy 930 map subdirectory A 952 to journaled EC storage volume 940(1). Such might be the case, for example, where subdirectory A 952 is intended to have metadata (e.g., ".map" files) directed thereto and stored therein. Similarly, subdirectory B 954 is mapped to non-journaled EC storage volume 945(1) and subdirectory C 956 is mapped to non-journaled EC storage volume 945(2), where such mappings are depicted simply as a demonstration of the additional storage required for data. To that end, such might be the case where subdirectory B 954 and subdirectory C 956 are intended to have data (e.g., ".bin" files) directed thereto and stored therein. As will be appreciated, the mappings just described can be effected, for example, by mounting the various volumes in volume set 920 on corresponding subdirectories in MVFS 910. With regard to such mappings, in certain embodiments, files with a given extension (e.g., ".map") belonging to multiple directories can, in fact, be stored in a particular volume (depending on the policy/policies implemented). Conversely, but in a similar vein, it is to also be appreciated that files stored in a particular directory can be distributed across multiple volumes. The present disclosure is intended to comprehend these and comparable alternatives.

Figure 9B:
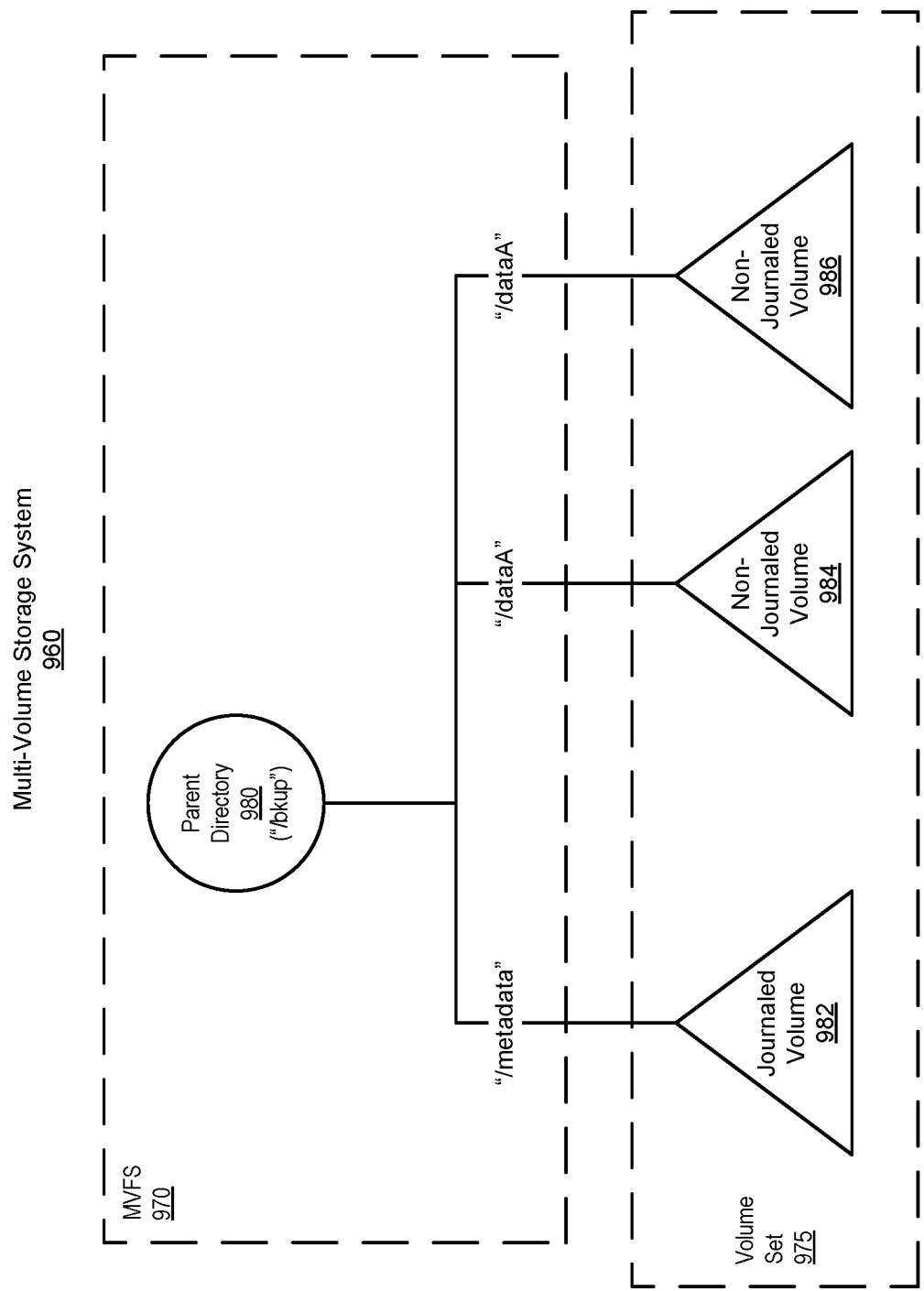
FIG. 9B is a simplified block diagram illustrating an example of a logical representation of a multi-volume storage system, according to embodiments of methods and systems such as those disclosed herein.

FIG. 9B is a simplified block diagram illustrating an example of a multi-volume storage system from a logical perspective, according to embodiments of methods and systems such as those disclosed herein. That being the case, FIG. 9B depicts a multi-volume storage (MVS) system 960. As noted, MVS system 960 is a logical representation of an MVFS such as MVFS 910 of FIG. 9A. that being the case, MVS system 960 includes an MVFS 970 and a volume set 975. MVFS 970, in turn, includes a parent directory 980. Parent directory 980 is, in the present example, a directory that is used to store backup information, and so is designated as "/bkup". Parent directory 980 is depicted as having three subdirectories, "/metadata", "/dataA", and "/dataB" (the full paths of which, in the present example, are "/bkup/metadata", "/bkup/dataA", and "/bkup/dataB", respectively). In the manner noted in connection with FIG. 9A, the "/metadata" subdirectory is, as its name implies, intended for the storage of non-data information (e.g., metadata, as well as other files), and so has a journaled volume (a journaled volume 982, which may be a journaled EC volume, a non-journaled n-way mirrored volume, or other storage system providing sufficiently-reliable storage) mounted thereto. In comparable fashion, non-journaled volumes are mounted to the "/dataA" and "/dataB" subdirectories (non-journaled volumes 984 and 986, respectively). It is once again noted that, while discussed in terms of EC storage, elements such as journaled volume 982 can, in fact, employ any sufficiently-reliable storage type, alone or in appropriate combination.

Figure 10:
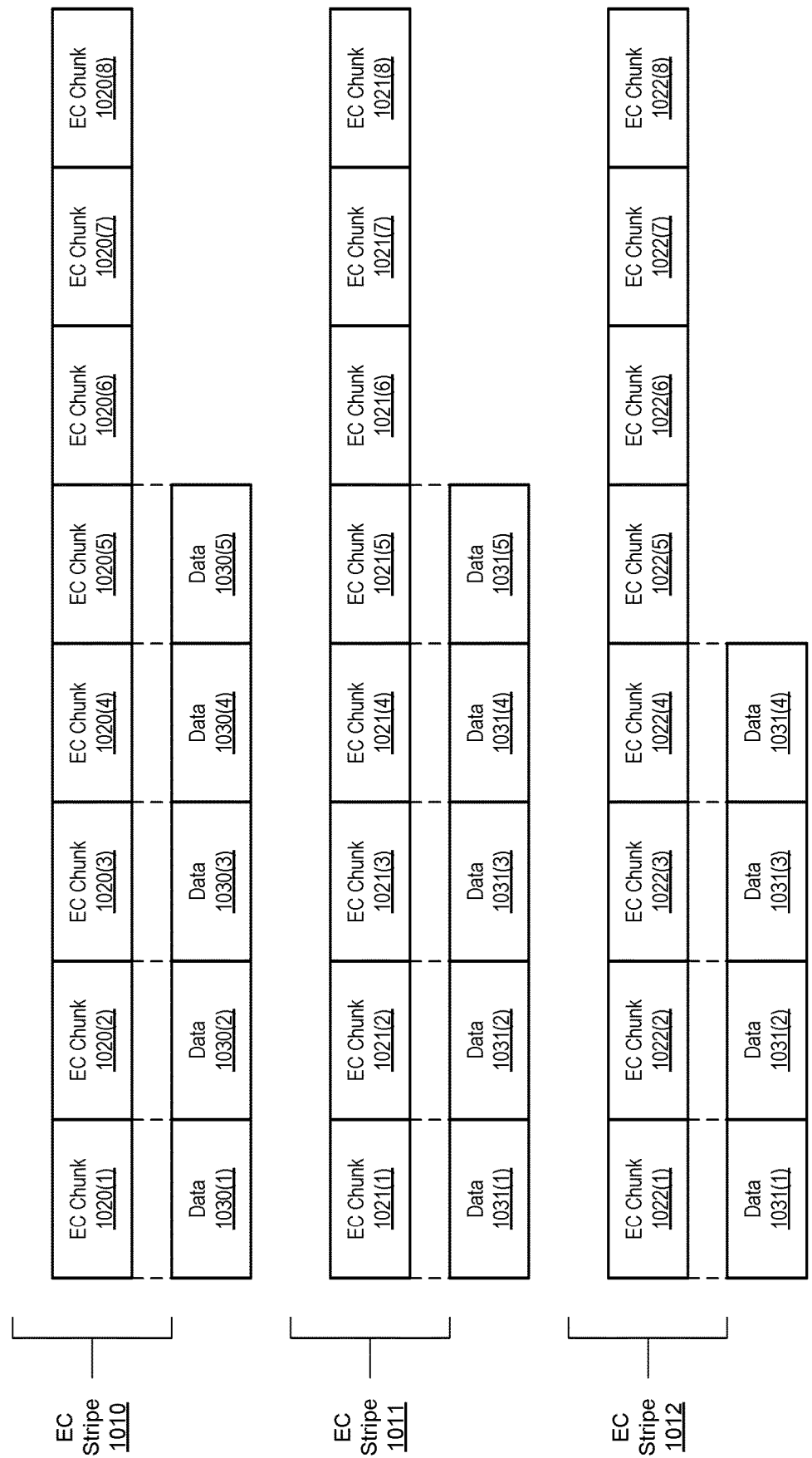
FIG. 10 is a simplified block diagram illustrating an example of the storage of data in erasure-coded storage, according to embodiments of methods and systems such as those disclosed herein.

FIG. 10 is a simplified block diagram illustrating an example of the potential storage of backup data in erasure-coded (EC) storage, according to embodiments of methods and systems such as those disclosed herein. Various of the aspects depicted in FIG. 10, as well as certain of the subsequent figures, are used to illustrate certain of the issues that can be encountered when supporting EC storage operations where distinctions are made between information types. FIG. 10 thus depicts the state of data stored in EC stripes (depicted in FIG. 10 as an EC stripe 1010, an EC stripe 1011, and an EC stripe 1012). EC stripes 1010, 1011, and 1012 each include a number of EC chunks, which appear as EC chunks 1020(1)-(8) (referred to in the aggregate as EC chunks 1020), EC chunks 1021(1)-(8) (referred to in the aggregate as EC chunks 1021), and EC chunks 1022(1)-(8) (referred to in the aggregate as EC chunks 1022), respectively. Data (which appears as data 1030(1)-(5), data 1031(1)-(5), and data 1031(1)-(4)) can be seen to start at an EC stripe boundary (the start boundary of EC stripe 1010), and ends with a partial EC stripe (data 1031(1)-(4) stored in EC chunks 1022(1)-(4), leaving EC chunk 1022(5) empty). Further, it will be appreciated that EC chunks 1021(6)-(8), EC chunks 1022(6)-(8), and EC chunks 1020(6)-(8) contain parity information, generated from EC chunks 1020(1)-(5), EC chunks 1022(1)-(5), and EC chunks 1020(1)-(5), respectively.

Figure 11:
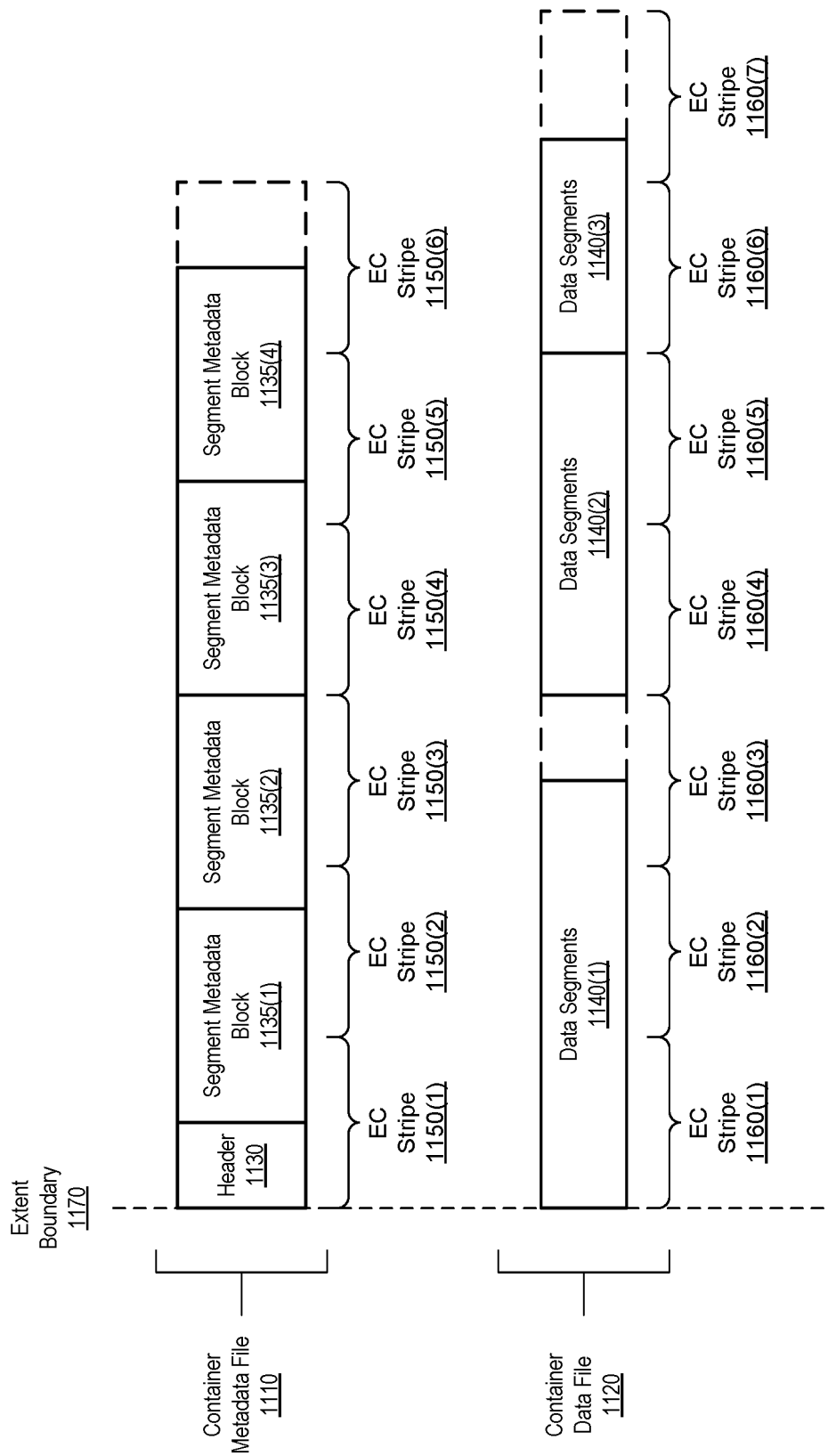
FIG. 11 is a simplified block diagram illustrating an example of the storage of data in erasure-coded storage, according to embodiments of methods and systems such as those disclosed herein.

FIG. 11 is a simplified block diagram illustrating an example of the storage of backup data in erasure-coded (EC) storage, according to embodiments of methods and systems such as those disclosed herein. While approaches such as that described in connection with FIG. 10 address the need to avoid corruption of existing data that is assumed to be successfully stored (e.g., existing backup data), and thus able to be made available, even in the face of some tolerable number of failures, the need to ensure such availability by way of separating such aggregations of data remains. In order to provide such functionality, an approach such as that depicted in FIG. 11 can be employed. FIG. 11 depicts the storage of a container metadata file 1110 and a container data file 1120 in EC storage. In turn, container metadata file 1110 includes a header 1130 and a number of segment metadata blocks, which are depicted in FIG. 11 as segment metadata blocks 1135(1)-(4) (and which are referred to in the aggregate as segment metadata blocks 1135), in the manner of the container metadata files described previously. Similarly, container data file 1120 includes a number of data segments, which are depicted in FIG. 11 as data segments 1140(1)-(3) (and which are referred to in the aggregate as data segments 1140), in the manner of the container data files described previously. It is to be appreciated that, as depicted in FIG. 11, each of data segments 1140(1), data segments 1140(2), and data segments 1140(3) can be single data segments, sets of data segments (i.e., more than one data segment), and/or a combination thereof. However, it is also to be appreciated that the storage of each of data segments 1140(1), data segments 1140(2), and data segments 1140(3) is a transactionally-separate operation, such that the success or failure of storage of one does not affect the storage of another from an erasure-coded storage standpoint. By forcing each such transactionally-separate operation to begin on another EC stripe, such isolation can be achieved.

Container metadata file 1110 and container data file 1120 are stored in EC storage. Such EC storage can include, for example, a number of EC stripes. Container metadata file 1110 is thus stored in EC stripes 1150(1)-(6), and the data segments of container data file 1120 are stored in EC stripes 1160(1)-(7). In order to prevent a data object such as a file (and so container metadata file 1110 and container data file 1120) from becoming corrupted, and so suffering from problems such as those mentioned earlier, the beginning of such files can be forced onto an EC stripe boundary. In so doing, the possibility of such a file sharing an EC stripe with another file (e.g., of another backup) is avoided.

Figure 12:
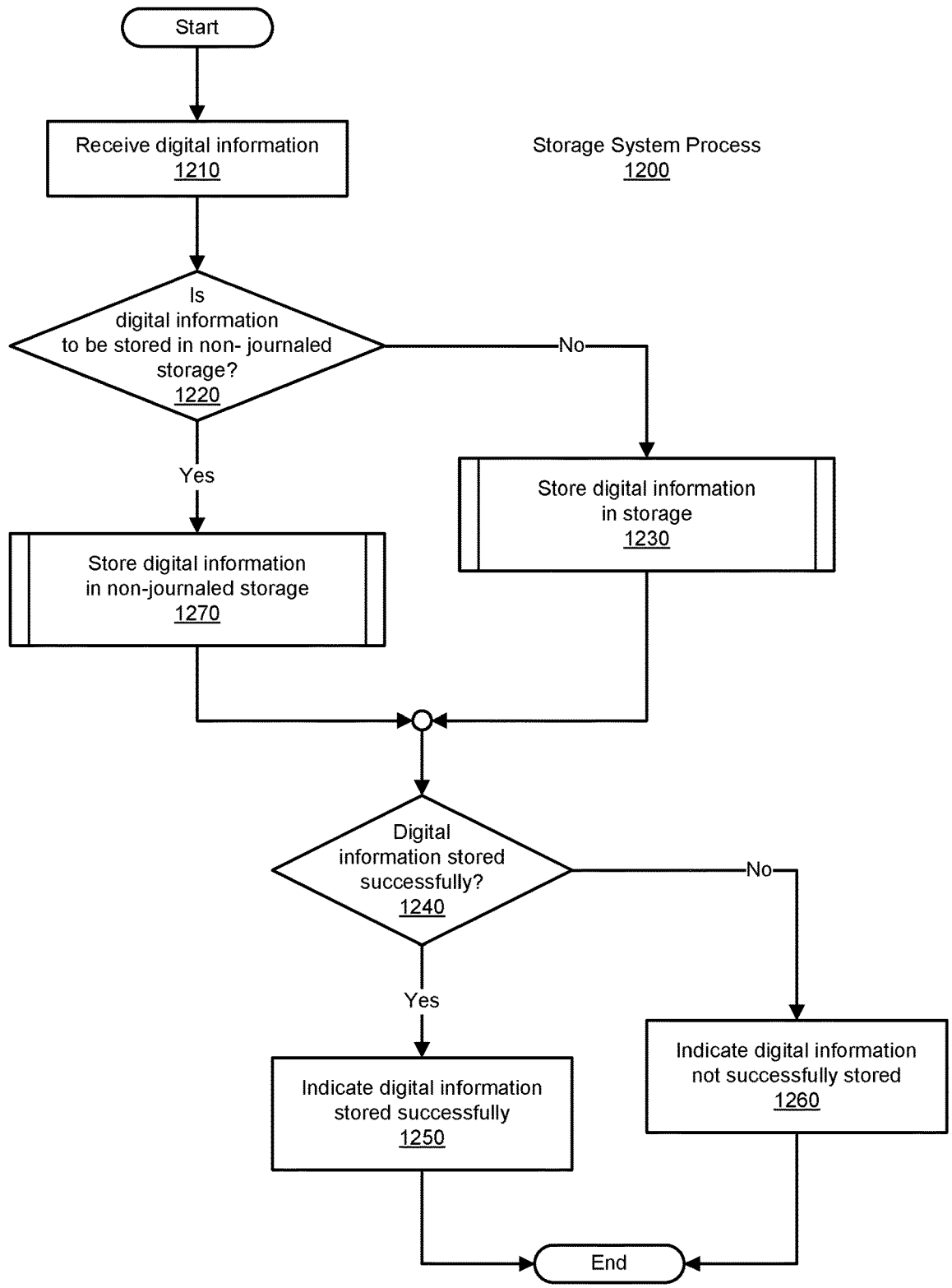
FIG. 12 is a flow diagram illustrating an example of a storage system process, according to embodiments of methods and systems such as those disclosed herein.

FIG. 12 is a flow diagram illustrating an example of a storage system process, according to embodiments of methods and systems such as those disclosed herein. That being the case, FIG. 12 depicts a storage system process 1200, which can be employed, for example, when storing the deduplicated data of a backup in an erasure-coded storage system. Storage system process 1200 begins by reading or otherwise receiving digital information (1210). A determination is then made as to whether the digital information thus received is to be stored in non-journaled storage (1220). If the digital information is to be stored in sufficiently-reliable storage (e.g., as a result of being metadata), a process of storing such digital information in storage is performed (1230). As described elsewhere herein, it is noted that, while discussed in terms of journaled EC storage at various points, the storage referred to in this regard can, in fact, employ any sufficiently-reliable storage type, alone or in appropriate combination, and be journaled (or not), as may be appropriate to the storage type employed.

For example, a container's metadata file or other non-data digital information (e.g., file system information) can be written to a journal by such a process (e.g., as when journaled EC storage is employed). As noted earlier, maintaining a journal of the original state of such container metadata allows such container metadata to be written to EC storage without risk to the integrity thereof. Thus, while such journaling does involve writing such information twice (once to the storage system, and once to the journal), the amount of overhead encountered is relatively small (given the relatively small amount of digital information involved) and such journaling allows the writing of such journal information to be performed in a transactional manner. This provides the benefit of a success/failure decision to be made, and so the operation to be retried, noted elsewhere herein. Moreover, given sufficient reliability of the storage employed in this regard (in light of the given circumstances), such a storage operation can be performed without the need for journaling (e.g., as when mirrored storage is employed in the given situation).

In this regard, a determination is made as to whether the digital information in question has been stored successfully (1240). If an indication that the digital information has been successfully stored is received, an indication to this effect is provided (1250). In view of the digital information having been stored successfully, such an indication reflects the fact that subsequent read operations can proceed, with the understanding that the reading of such digital information will return the (new) digital information just written. Alternatively, if an indication is received that indicates the digital information was not stored successfully, an indication to this effect is provided (1260). In this case, given that the digital information was not stored successfully, such an indication reflects the fact that a subsequent read operation will return the (original) digital information (rather than the new digital information). In either event, storage system process 1200 then concludes.

If, in the alternative, it is determined that the digital information is not to be journaled, a process of storing such digital information in non-journaled storage is performed (1270). Thus, by contrast, data to be written to a container data file is not journaled, according to embodiments such as those described herein. This is advantageous due to the relatively large amount of information stored in such container data files, and the overhead that would be involved in such journaling. However, the writing of such container data files can be performed on a transactional basis, allowing the addition of such information (or its appending) into a container data file on a transactional basis. That being the case, when storing such data in non-journaled EC storage, the creation of the container data file, as well as the appending of information (e.g., data segments), are performed on an EC stripe boundary (ECSB) in certain embodiments, in order to avoid the problems described previously. By ensuring that a container file that is created, is created starting on an ECSB (an operation which is performed on a transactional basis), and the appending of data into a container file is also performed on an ECSB (an operation which is also performed on a transactional basis), problems resulting from multiple files and/or multiple data segment sets being stored, at least in part, in a single EC stripe (i.e., sharing a single EC stripe, with portions of two or more such files and/or data segment sets occupying the same EC stripe), can be avoided.

With regard to storage system process 1200, if a given container data file does not exist, the container data file can be created, or if the container file exists, the container data file can be opened for write operations. Metrics with regard to the particular non-journaled EC storage volume to which such data might be stored can include current container data file size, amount of data to be stored, and other such characteristics of the given situation can be considered when making this determination. Such criteria can also be applied with regard to the determination as to whether to create a new container.

As noted elsewhere herein, the writing of information to an ECS system can be forced to begin on an ECSB. For example, a file system can be configured with its smallest unit of storage (e.g., an extent) equal in size to an integer multiple of the EC stripe size. Given that a file system's smallest unit of storage will be allotted to the storage of information in integer multiples thereof, equating such units of storage with some integer multiple of EC stripes results in writes to storage objects stored by the file system (e.g., files and information appended thereto) to be on EC stripe boundaries. For example, a file system based on extents (i.e., a standard minimum amount of data handled by such a file system) can have its extent size set to an integer multiple of the EC stripe size of the given ECS system. Thus, as is depicted in storage system process 1200, metadata such as container metadata is read, updates and/or append operations performed thereon, the resulting metadata journaled, and then written to the (EC) storage system. It should be noted here that the digital information within the container metadata file (e.g., the container metadata file header and one or more segment metadata blocks) need not be aligned internally with regard to EC stripe boundaries. Given that the writing of the file will occur on an EC stripe boundary, the writing of the container metadata file can be treated as transactional in nature, given that the container metadata file is journaled and in the event of a failure such a storage operation can simply be restarted using that journaled copy.

Figure 13:
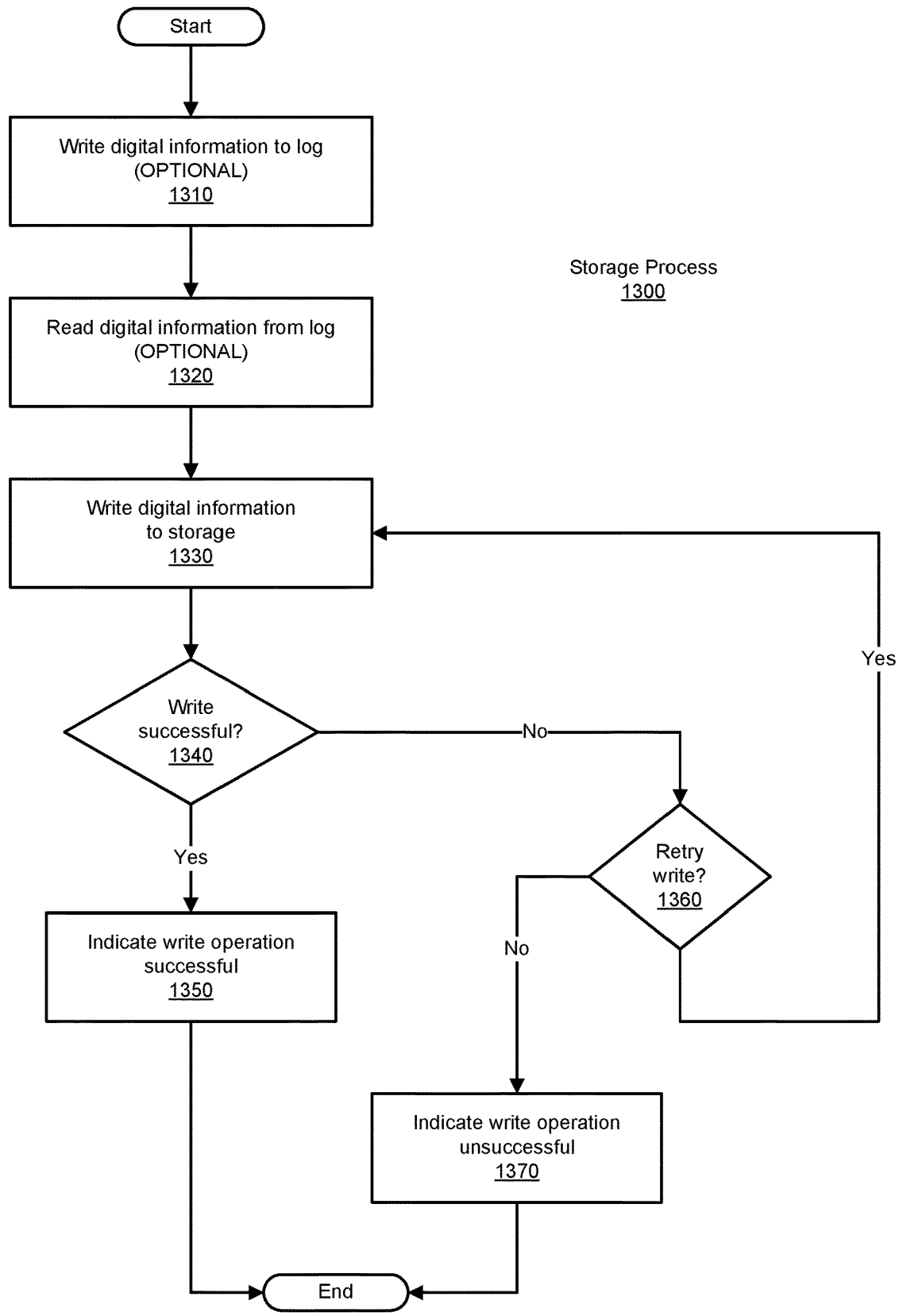
FIG. 13 is a flow diagram illustrating an example of a storage process, according to embodiments of methods and systems such as those disclosed herein.

FIG. 13 is a flow diagram illustrating an example of a storage process, according to embodiments of methods and systems such as those disclosed herein. That being the case, FIG. 13 depicts a storage process 1300. Given that storage process 1300 is employed when storing metadata and other non-data digital information, storage process 1300 begins by writing the digital information in question to a log (1310). As was noted earlier, while EC storage can be employed in this regard, such need not be the case, so long as such storage need only be sufficiently reliable with regard to the storage of such information. As noted earlier, such storage can, in fact, be implemented using any sufficiently-reliable storage type, including not only EC storage, but also non-EC storage, in any appropriate combination. For example, n-way mirrored, RAID 0 through RAID 6, nested RAID, and other sufficiently-reliable storage methods can be employed. Further still, as noted in FIG. 13, the storage of metadata and other non-data digital information in a log (i.e., as would be done when journaling is employed) is optional. If the given storage type is of sufficient reliability (e.g., n-way mirrored storage), such journaling need not be performed.

Once the digital information has been written to the log, in certain embodiments, the digital information may be read from the log, in preparation for writing such digital information to storage (1320). Again, such read operations are optional. This can be, for example, because journaling is not employed, or the logged digital information is written to both the log and to storage in the same operation (e.g., as by writing the digital information twice, by virtue of the log employing a write-through mechanism, or by way of some other mechanism). In either event, and attempt is then made to write the digital information to storage (1330). A determination is then made as to whether this write operation was successful (1340). If the digital information was successfully written to storage, an indication to this effect is provided (1350). Storage process 1300 then concludes.

Alternatively, if a determination is made that the write operation was unsuccessful, a determination is made as to whether the write operation should be retried (1360). If another attempt to write the digital information to EC storage is to be made, storage process 1300 loops to making another such attempt (1330). Alternatively, if another attempt to write the digital information to EC storage will not be made (e.g., a maximum number of attempts have been made), an indication to the effect that the right operation was unsuccessful is provided (1370). As before, storage process 1300 then concludes.

Figure 14:
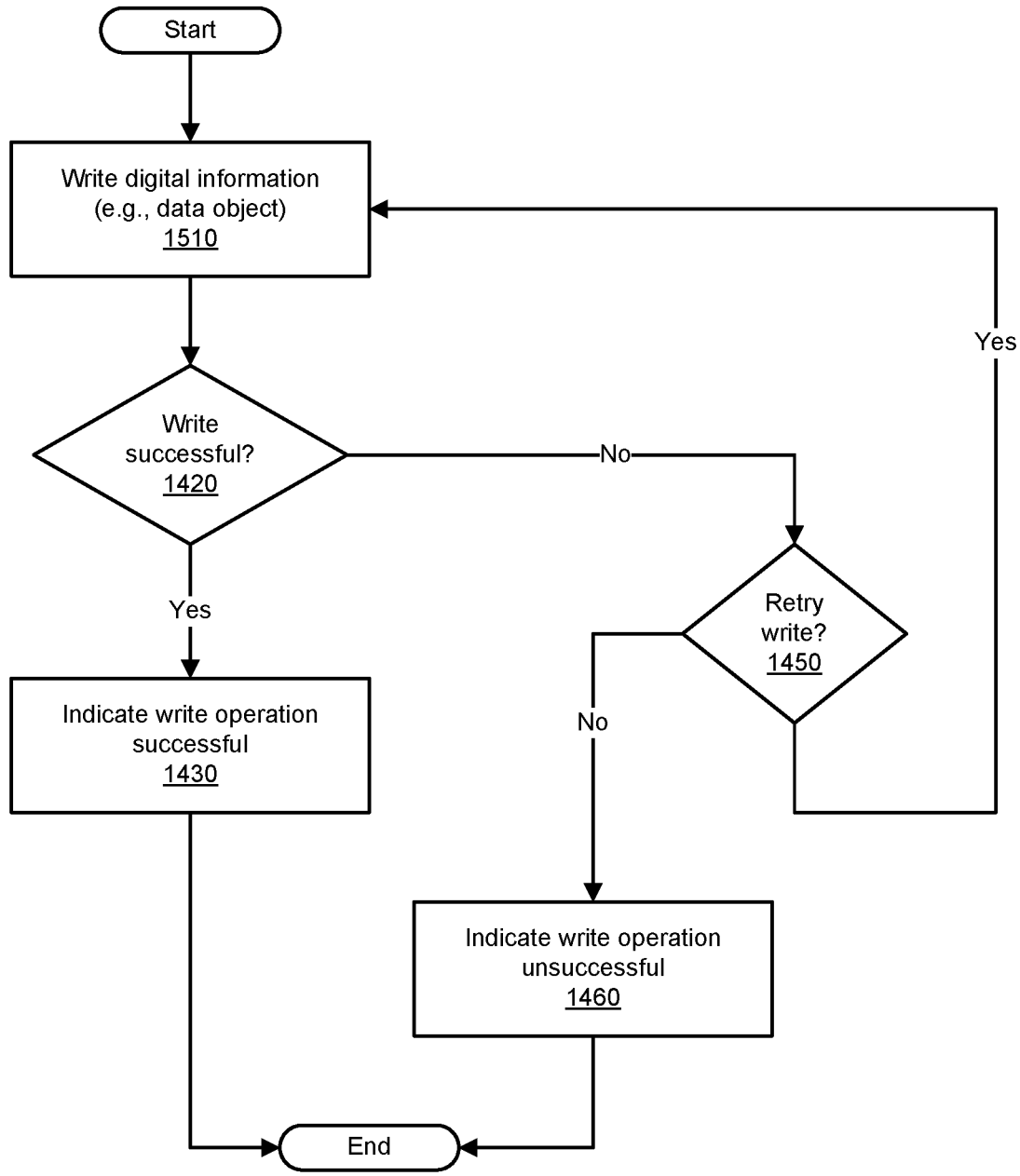
FIG. 14 is a flow diagram illustrating an example of a non-journaled storage process, according to embodiments of methods and systems such as those disclosed herein.

FIG. 14 is a flow diagram illustrating an example of a non-journaled storage process, according to embodiments of methods and systems such as those disclosed herein. That being the case, FIG. 14 depicts a non-journaled storage process 1400. Given that non-journaled storage process 1400 is intended to be employed only when storing data, non-journaled storage process 1400 begins by simply writing the digital information in question (e.g., a data object, container data file, or the like) in a transactional fashion.

As noted earlier, in order to allow data to be written in a manner that ensures data integrity, certain constraints should be imposed. For example, writing data as a data object, container data file, or other such storage constructs (having WORM properties) can be used to avoid the unwanted overwriting of existing data. Problems related to partial writes can be avoided by ensuring that no more than one process (or thread) writes to a given EC stripe at any one time. In this regard, writing of the storage construct in question on EC stripe boundaries (ECSBs) and allowing such storage constructs to consume partial EC stripes also helps to avoid partially-written EC stripes. A determination is then made as to whether this write operation was successful (1420). If the digital information was successfully written to EC storage, an indication to this effect is provided (1430). Non-journaled storage process 1400 then concludes.

In certain embodiments, multiple attempts to successfully write the data object, container data file, or other such construct may be made. However, such multiple attempts will typically be made at the application level, rather than at the storage system level (the core concept in this regard being that the trade-off for avoiding the aforementioned "double write" penalty is an all-or-nothing treatment of such non-journaled EC right operations). Notwithstanding, should multiple attempts be employed, a determination can be made as to the write operation being unsuccessful, and a further determination made as to whether the write operation should be retried (1440). If another attempt to write the digital information to EC storage is to be made, non-journaled storage process 1400 loops to making another such attempt (1410). Alternatively, if another attempt to write the digital information to EC storage will not be made (e.g., a maximum number of attempts have been made), an indication to the effect that the right operation was unsuccessful is provided (1450). As before, non-journaled storage process 1400 then concludes.

An Example Computing and Network Environment

As noted, the systems described herein can be implemented using a variety of computer systems and networks. The following illustrates an example configuration of a computing device such as those described herein. The computing device may include one or more processors, a random access memory (RAM), communication interfaces, a display device, other input/output (I/O) devices (e.g., keyboard, trackball, and the like), and one or more mass storage devices (e.g., optical drive (e.g., CD, DVD, or Blu-ray), disk drive, solid state disk drive, non-volatile memory express (NVME) drive, or the like), configured to communicate with each other, such as via one or more system buses or other suitable connections. While a single system bus is illustrated for ease of understanding, it should be understood that the system buses may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, or the like.

Such CPUs are hardware devices that may include a single processing unit or a number of processing units, all of which may include single or multiple computing units or multiple cores. Such a CPU may include a graphics processing unit (GPU) that is integrated into the CPU or the GPU may be a separate processor device. The CPU may be implemented as one or more microprocessors, microcomputers, microcontrollers, digital signal processors, central processing units, graphics processing units, state machines, logic circuitries, and/or any devices that manipulate signals based on operational instructions. Among other capabilities, the CPU may be configured to fetch and execute computer-readable instructions stored in a memory, mass storage device, or other computer-readable storage media.

Memory and mass storage devices are examples of computer storage media (e.g., memory storage devices) for storing instructions that can be executed by the processors 502 to perform the various functions described herein. For example, memory can include both volatile memory and non-volatile memory (e.g., RAM, ROM, or the like) devices. Further, mass storage devices may include hard disk drives, solid-state drives, removable media, including external and removable drives, memory cards, flash memory, floppy disks, optical disks (e.g., CD, DVD, Blu-ray), a storage array, a network attached storage, a storage area network, or the like. Both memory and mass storage devices may be collectively referred to as memory or computer storage media herein and may be any type of non-transitory media capable of storing computer-readable, processor-executable program instructions as computer program code that can be executed by the processors as a particular machine configured for carrying out the operations and functions described in the implementations herein.

The computing device may include one or more communication interfaces for exchanging data via a network. The communication interfaces can facilitate communications within a wide variety of networks and protocol types, including wired networks (e.g., Ethernet, DOCSIS, DSL, Fiber, USB, etc.) and wireless networks (e.g., WLAN, GSM, CDMA, 802.11, Bluetooth, Wireless USB, ZigBee, cellular, satellite, etc.), the Internet and the like. Communication interfaces can also provide communication with external storage, such as a storage array, network attached storage, storage area network, cloud storage, or the like.

The display device may be used for displaying content (e.g., information and images) to users. Other I/O devices may be devices that receive various inputs from a user and provide various outputs to the user, and may include a keyboard, a touchpad, a mouse, a printer, audio input/output devices, and so forth. The computer storage media, such as memory 504 and mass storage devices, may be used to store software and data, such as, for example, an operating system, one or more drivers (e.g., including a video driver for a display such as display 150), one or more applications, and data. Examples of such computing and network environments are described below with reference to FIGS. 15 and 16.

Figure 15:
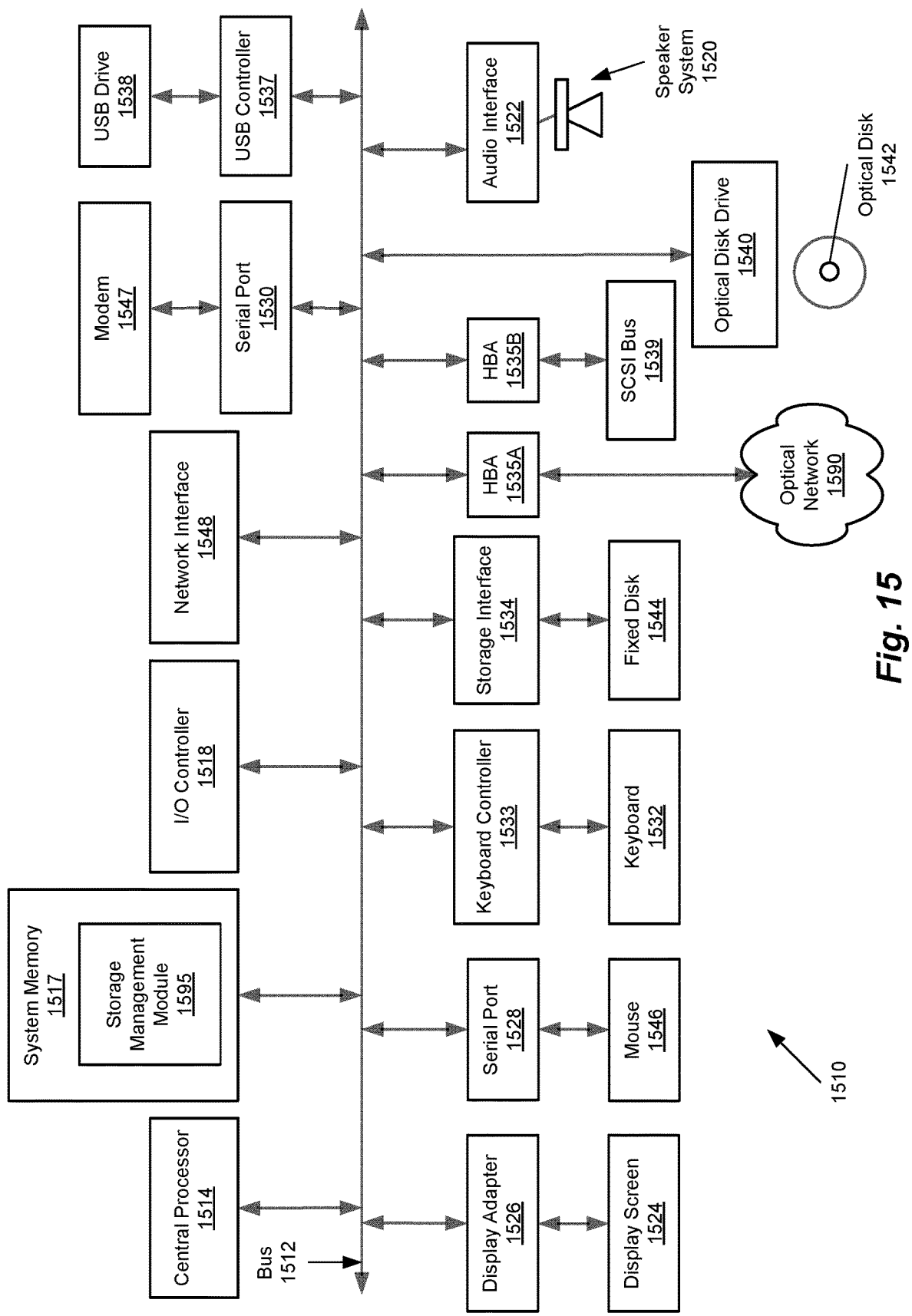
FIG. 15 is a block diagram depicting a computer system suitable for implementing embodiments of methods and systems such as those disclosed herein.

FIG. 15 depicts a block diagram of a computer system 1510 suitable for implementing aspects of the systems described herein. Computer system 1510 includes a bus 1512 which interconnects major subsystems of computer system 1510, such as a central processor 1514, a system memory 1517 (typically RAM, but which may also include ROM, flash RAM, or the like), an input/output controller 1518, an external audio device, such as a speaker system 1520 via an audio output interface 1522, an external device, such as a display screen 1524 via display adapter 1526, serial ports 1528 and 1530, a keyboard 1532 (interfaced with a keyboard controller 1533), a storage interface 1534, a USB controller 1537 operative to receive a USB drive 1538, a host bus adapter (HBA) interface card 1535A operative to connect with a optical network 1590, a host bus adapter (HBA) interface card 1535B operative to connect to a SCSI bus 1539, and an optical disk drive 1540 operative to receive an optical disk 1542. Also included are a mouse 1546 (or other point-and-click device, coupled to bus 1512 via serial port 1528), a modem 1547 (coupled to bus 1512 via serial port 1530), and a network interface 1548 (coupled directly to bus 1512).

Bus 1512 allows data communication between central processor 1514 and system memory 1517, which may include read-only memory (ROM) or flash memory (neither shown), and random access memory (RAM) (not shown), as previously noted. RAM is generally the main memory into which the operating system and application programs are loaded. The ROM or flash memory can contain, among other code, the Basic Input-Output System (BIOS) which controls basic hardware operation such as the interaction with peripheral components. Applications resident with computer system 1510 are generally stored on and accessed from a computer-readable storage medium, such as a hard disk drive (e.g., fixed disk 1544), an optical drive (e.g., optical drive 1540), a universal serial bus (USB) controller 1537, or other computer-readable storage medium.

Storage interface 1534, as with the other storage interfaces of computer system 1510, can connect to a standard computer-readable medium for storage and/or retrieval of information, such as a fixed disk drive 1544. Fixed disk drive 1544 may be a part of computer system 1510 or may be separate and accessed through other interface systems. Modem 1547 may provide a direct connection to a remote server via a telephone link or to the Internet via an internet service provider (ISP). Network interface 1548 may provide a direct connection to a remote server via a direct network link to the Internet via a POP (point of presence). Network interface 1548 may provide such connection using wireless techniques, including digital cellular telephone connection, Cellular Digital Packet Data (CDPD) connection, digital satellite data connection or the like. Also depicted as part of computer system 1510 is a storage management module 1595, which is resident in system memory 1517 and provides functionality and operations comparable to the storage management processes described earlier herein (e.g., including an MVFS such as that described earlier, or portions thereof).

Many other devices or subsystems (not shown) may be connected in a similar manner (e.g., document scanners, digital cameras and so on). Conversely, all of the devices shown in FIG. 15 need not be present to practice the systems described herein. The devices and subsystems can be interconnected in different ways from that shown in FIG. 15. The operation of a computer system such as that shown in FIG. 15 will be readily understood in light of the present disclosure. Code to implement portions of the systems described herein can be stored in computer-readable storage media such as one or more of system memory 1517, fixed disk 1544, optical disk 1542, or USB drive 1538. The operating system provided on computer system 1510 may be WINDOWS, UNIX, LINUX, IOS, or other operating system.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

Figure 16:
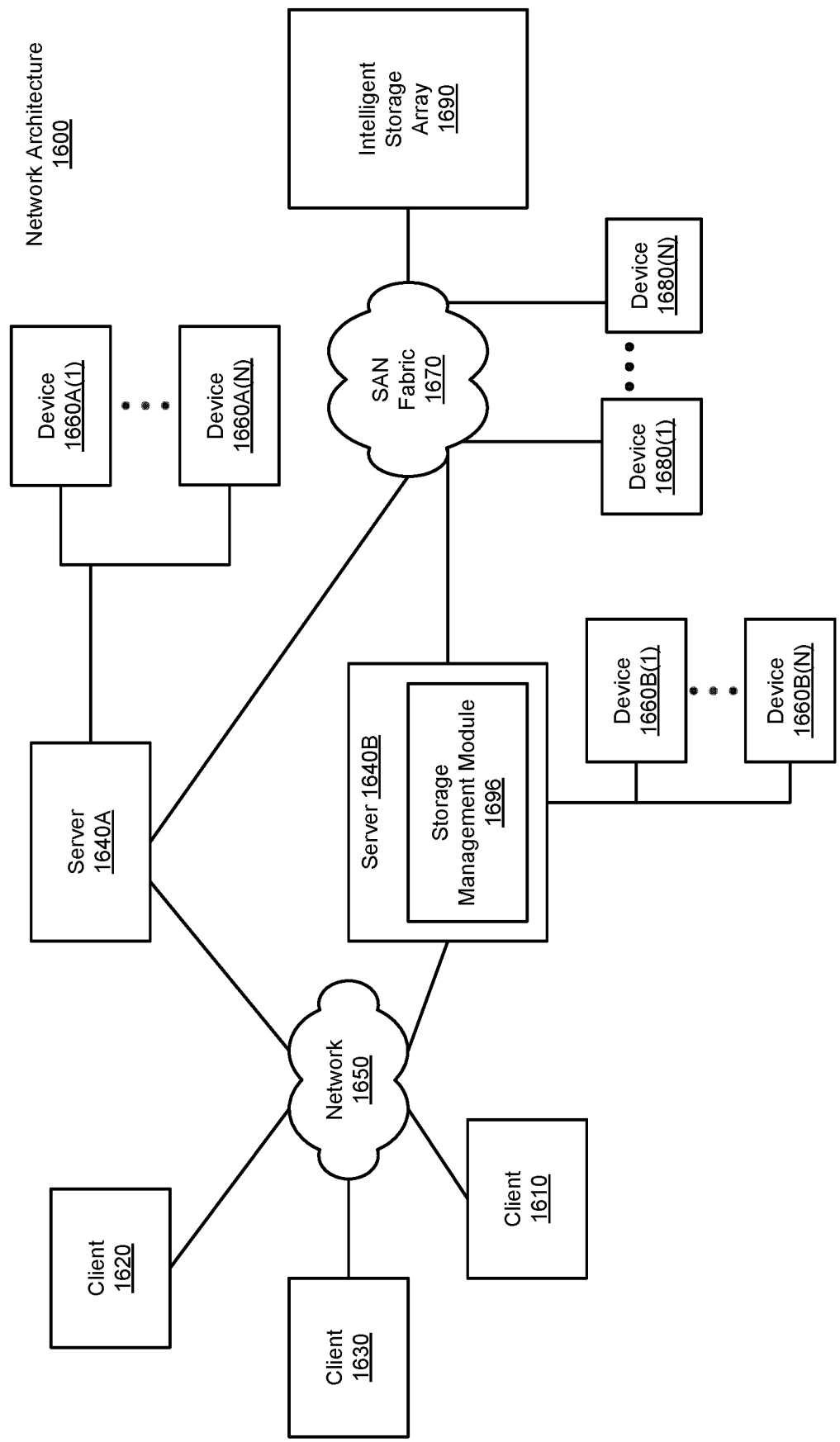
FIG. 16 is a block diagram depicting a network architecture suitable for implementing embodiments of methods and systems such as those disclosed herein.

FIG. 16 is a block diagram depicting a network architecture 1600 in which client systems 1610, 1620 and 1630, as well as storage servers 1640A and 1640B (any of which can be implemented using computer system 1610), are coupled to a network 1650. Storage server 1640A is further depicted as having storage devices 1660A(1)-(N) directly attached, and storage server 1640B is depicted with storage devices 1660B(1)-(N) directly attached. Storage servers 1640A and 1640B are also connected to a SAN fabric 1670, although connection to a storage area network is not required for operation. SAN fabric 1670 supports access to storage devices 1680(1)-(N) by storage servers 1640A and 1640B, and so by client systems 1610, 1620 and 1630 via network 1650. An intelligent storage array 1690 is also shown as an example of a specific storage device accessible via SAN fabric 1670.

Also depicted as part of network architecture 1600 is a storage management module 1696 (installed in server 1640B), which is comparable in function and operation to various of the storage management modules described earlier herein (e.g., including an MVFS such as that described earlier, or portions thereof). For example, using the components depicted earlier, storage management module 1696 can provide functionality associated with the management of data in an EC storage system, as depicted in and described in connection therewith.

With reference to computer system 1510, modem 1547, network interface 1548 or some other method can be used to provide connectivity from each of client computer systems

1610, 1620 and 1630 to network 1650. Client systems 1610, 1620 and 1630 are able to access information on storage server 1640A or 1640B using, for example, a web browser or other client software (not shown). Such a client allows client systems 1610, 1620 and 1630 to access data hosted by storage server 1640A or 1640B or one of storage devices 1660A(1)-(N), 1660B(1)-(N), 1680(1)-(N) or intelligent storage array 1690. FIG. 16 depicts the use of a network such as the Internet for exchanging data, but the systems described herein are not limited to the Internet or any particular network-based environment.

Other Embodiments

The example systems and computing devices described herein are well adapted to attain the advantages mentioned as well as others inherent therein. While such systems have been depicted, described, and are defined by reference to particular descriptions, such references do not imply a limitation on the claims, and no such limitation is to be inferred. The systems described herein are capable of considerable modification, alteration, and equivalents in form and function, as will occur to those ordinarily skilled in the pertinent arts in considering the present disclosure. The depicted and described embodiments are examples only, and are in no way exhaustive of the scope of the claims.

Such example systems and computing devices are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

The foregoing thus describes embodiments including components contained within other components (e.g., the various elements shown as components of computer system 1510). Such architectures are merely examples, and, in fact, many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation. As such, the various embodiments of the systems described herein via the use of block diagrams, flowcharts, and examples. It will be understood by those within the art that each block diagram component, flowchart step, operation and/or component illustrated by the use of examples can be implemented (individually and/or collectively) by a wide range of hardware, software, firmware, or any combination thereof.

The systems described herein have been described in the context of fully functional computer systems; however, those skilled in the art will appreciate that the systems described herein are capable of being distributed as a program product in a variety of forms, and that the systems described herein apply equally regardless of the particular type of computer-readable media used to actually carry out the distribution. Examples of computer-readable media include computer-readable storage media, as well as media storage and distribution systems developed in the future.

The above-discussed embodiments can be implemented by software modules that perform one or more tasks associated with the embodiments. The software modules discussed herein may include script, batch, or other executable files. The software modules may be stored on a machine-readable or computer-readable storage media such as magnetic floppy disks, hard disks, semiconductor memory (e.g., RAM, ROM, and flash-type media), optical discs (e.g., CD-ROMs, CD-Rs, and DVDs), or other types of memory modules. A storage device used for storing firmware or hardware modules in accordance with an embodiment can also include a semiconductor-based memory, which may be permanently, removably or remotely coupled to a microprocessor/memory system. Thus, the modules can be stored within a computer system memory to configure the computer system to perform the functions of the module. Other new and various types of computer-readable storage media may be used to store the modules discussed herein.

In light of the foregoing, it will be appreciated that the foregoing descriptions are intended to be illustrative and should not be taken to be limiting. As will be appreciated in light of the present disclosure, other embodiments are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the claims. Variations and modifications of the embodiments disclosed herein can be made based on the description set forth herein, without departing from the scope of the claims, giving full cognizance to equivalents thereto in all respects.

Although the systems described herein have been described in connection with several embodiments, these embodiments and their descriptions are not intended to be limited to the specific forms set forth herein. On the contrary, it is intended that such embodiments address such alternatives, modifications, and equivalents as can be reasonably included within the scope of the appended claims.

What is claimed is:

1. A computer-implemented method, implemented in a computer system, comprising:
   determining an information type of digital information, wherein
      the digital information is to be written to a storage system;
   in response to a determination that the information type is a first information type,
      writing the digital information using a first process, wherein
         the first information type is metadata, and
         the first process comprises
            writing the digital information to a log, and
            writing the digital information to a storage unit of the storage system; and
   in response to a determination that the information type is a second information type,
      determining erasure-coded parity information for the digital information, wherein
         the second information type is data, and
         the digital information is to be written to an erasure-coded storage unit of the storage system, and
      writing the digital information using a second process, wherein
         the second process comprises
            writing the digital information and the erasure-coded parity information to the erasure-coded storage unit, without writing the digital information to the log.

2. The method of claim 1, wherein
   the storage unit comprises journaled storage,
   the erasure-coded storage unit comprises non-journaled erasure-coded storage,
   the first process writes the digital information to the journaled storage, and
   the second process writes the digital information to the non-journaled erasure-coded storage.

3. The method of claim 2, wherein
   the journaled storage is a journaled erasure-coded storage volume, and
   the non-journaled erasure-coded storage is a non-journaled erasure-coded storage volume.

4. The method of claim 2, wherein
   the non-journaled erasure-coded storage comprises a non-journaled erasure-coded storage volume.

5. The method of claim 4, wherein
   the journaled storage is journaled erasure-coded storage,
   the first process writes the digital information to the journaled erasure-coded storage, and
   the second process writes the digital information to the non-journaled erasure-coded storage.

6. The method of claim 5, further comprising:
   determining other erasure-coded parity information for other digital information; and
   writing the other digital information and the other erasure-coded parity information to the journaled storage.

7. The method of claim 2, wherein
   the writing the digital information to the erasure-coded storage unit comprises the writing the digital information to the log,
   the digital information is a file of a container, and
   the file is one of a data file or a metadata file.

8. The method of claim 7, wherein
   the journaled storage comprises a journaled storage volume,
   the non-journaled erasure-coded storage comprises a non-journaled erasure-coded storage volume,
   the storage unit and the erasure-coded storage unit are spanned by a multi-volume file system,
   a file system attribute of the journaled storage volume is set to "metadataok", and
   a file system attribute of the non-journaled erasure-coded storage volume is set to "dataonly".

9. The method of claim 1, wherein
   the storage unit is of a storage type, and
   the storage type is erasure-coded storage.

10. The method of claim 4, wherein the writing the digital information and the erasure-coded parity information to the erasure-coded storage unit, without writing the digital information to the log, comprises:
    writing the data to the non-journaled erasure-coded storage volume of the erasure-coded storage unit.

11. The method of claim 10, further comprising:
    dividing the data into a plurality of extents, wherein
       a size of each extent of the plurality of extents is such that the writing the data to the non-journaled erasure-coded storage volume facilitates the each extent of the plurality of extents being written starting on an erasure-coded stripe boundary of the non-journaled erasure-coded storage volume.

12. The method of claim 1, wherein
    the storage unit is of a storage type, and
    the storage type is at least one of
       an n-way mirrored storage type,
       a redundant array of independent disks storage type, or
       a nested redundant array of inexpensive disks storage type.

13. A non-transitory computer-readable storage medium, comprising program instructions, which, when executed by one or more processors of a computing system, perform a method comprising:
    determining an information type of digital information, wherein
       the digital information is to be written to a storage system;
    in response to a determination that the information type is a first information type,
       writing the digital information using a first process, wherein
          the first information type is metadata, and
          the first process comprises
             writing the digital information to a log, and
             writing the digital information to a storage unit of the storage system; and
    in response to a determination that the information type is a second information type,
       determining erasure-coded parity information for the digital information, wherein
          the second information type is data, and
          the digital information is to be written to an erasure-coded storage unit of the storage system, and writing the digital information using a second process, wherein
the second process comprises
writing the digital information and the erasure-coded parity information to the erasure-coded storage unit, without writing the digital information to the log.

14. The non-transitory computer-readable storage medium of claim 13, wherein
the storage unit comprises journaled storage,
the erasure-coded storage unit comprises non-journaled erasure-coded storage,
the first process writes the digital information to the journaled storage, and
the second process writes the digital information to the non-journaled erasure-coded storage.

15. The non-transitory computer-readable storage medium of claim 14, wherein
the digital information is one of a data file or a metadata file, and
the storage unit and the erasure-coded storage unit are spanned by a multi-volume file system.

16. The non-transitory computer-readable storage medium of claim 13, wherein
the storage unit is of a storage type, and
the storage type is erasure-coded storage.

17. The non-transitory computer-readable storage medium of claim 14, wherein
the non-journaled erasure-coded storage comprises a non-journaled erasure-coded storage volume, and
the writing the digital information and the erasure-coded parity information to the erasure-coded storage unit, without writing the digital information to the log, comprises
writing the data to the non-journaled erasure-coded storage volume of the erasure-coded storage unit.

18. The non-transitory computer-readable storage medium of claim 17, wherein the method further comprises:
dividing the data into a plurality of extents, wherein
the non-journaled erasure-coded storage comprises a non-journaled erasure-coded storage volume, and
a size of each extent of the plurality of extents is such that the writing the data to the non-journaled erasure-coded storage volume facilitates the each extent of the plurality of extents being written starting on an erasure-coded stripe boundary of the non-journaled erasure-coded storage volume.

19. The non-transitory computer-readable storage medium of claim 14, wherein
the first process writes the digital information to the journaled storage, and
the second process writes the digital information to the non-journaled erasure-coded storage.

20. A computing system comprising:
one or more processors, wherein
the computing system is configured to be communicatively coupled to a storage system; and
a computer-readable storage medium coupled to the one or more processors, comprising program instructions, which, when executed by the one or more processors, perform a method comprising
determining an information type of digital information, wherein
the digital information is to be written to the storage system,
in response to a determination that the information type is a first information type,
writing the digital information using a first process, wherein
the first information type is metadata, and
the first process comprises
writing the digital information to a log, and
writing the digital information to a storage unit of the storage system, and
in response to a determination that the information type is a second information type,
determining erasure-coded parity information for the digital information, wherein
the second information type is data, and
the digital information is to be written to an erasure-coded storage unit of the storage system, and
writing the digital information using a second process, wherein
the second process comprises
writing the digital information and the erasure-coded parity information to the erasure-coded storage unit, without writing the digital information to the log.

* * * * *